United States Patent
Kwok et al.

(10) Patent No.: US 12,341,530 B1
(45) Date of Patent: Jun. 24, 2025

(54) CHECK NODE UPDATES IN BIT FLIPPING DECODERS

(71) Applicant: SK Hynix NAND Product Solutions Corp., Rancho Cordova, CA (US)

(72) Inventors: Zion Kwok, Burnaby (CA); Young Joon Ji, Vancouver (CA)

(73) Assignee: SK Hynix NAND Product Solutions Corp., Rancho Cordova, CA (US)

( * ) Notice: Subject to any disclaimer, the term of this patent is extended or adjusted under 35 U.S.C. 154(b) by 0 days.

(21) Appl. No.: 18/391,223

(22) Filed: Dec. 20, 2023

(51) Int. Cl.
*H03M 13/00* (2006.01)
*H03M 13/11* (2006.01)

(52) U.S. Cl.
CPC .... *H03M 13/1108* (2013.01); *H03M 13/1128* (2013.01); *H03M 13/1131* (2013.01)

(58) Field of Classification Search
CPC ......... H03M 13/1108; H03M 13/1128; H03M 13/1131; H03M 13/1165; H03M 13/1162; H03M 13/15; H03M 13/116
See application file for complete search history.

(56) References Cited

U.S. PATENT DOCUMENTS

| | | | | |
|---|---|---|---|---|
| 8,392,789 | B2* | 3/2013 | Biscondi | H03M 13/1114 |
| | | | | 714/755 |
| 9,548,764 | B1* | 1/2017 | Chilappagari | H03M 13/116 |
| 10,374,639 | B2* | 8/2019 | Bazarsky | H03M 13/1108 |
| 10,389,388 | B2* | 8/2019 | Tate | H03M 13/1108 |
| 10,879,930 | B2* | 12/2020 | Ha | H03M 13/1108 |
| 11,088,707 | B2* | 8/2021 | Palangappa | G06F 17/16 |
| 11,309,915 | B1* | 4/2022 | Mitchell | H03M 13/616 |
| 11,515,891 | B2* | 11/2022 | Vanaparthy | H03M 13/3723 |

* cited by examiner

*Primary Examiner* — Esaw T Abraham
(74) *Attorney, Agent, or Firm* — Morgan, Lewis & Bockius LLP

(57) ABSTRACT

This application is directed to error correction for data stored in a memory device. In response to a request to validate a block of data, the memory device identifies a set of check nodes corresponding to a set of variable nodes that represent the block of data. First check node values of the check nodes are determined based on the block of data, and stored in first registers. The memory device implements a plurality of iterations of error correction by flipping a subset of variable nodes successively during each iteration; determining second check node values of the check nodes; and updating the first check node values stored in the first registers based on the second check node values once in each of a first set of iterations and successively with flipping of each variable node in a second set of iterations following the first set of iterations.

20 Claims, 11 Drawing Sheets

CHECK NODE UPDATES IN BIT FLIPPING DECODERS

TECHNICAL FIELD

This application relates generally to memory management including, but not limited to, methods, systems, and non-transitory computer-readable storage media for correcting errors in data stored in a memory device (e.g., solid-state drive).

BACKGROUND

Memory is applied in a computer system to store instructions and data. The data are processed by one or more processors of the computer system according to the instructions stored in the memory. Multiple memory units are used in different portions of the computer system to serve different functions. Specifically, the computer system includes non-volatile memory that acts as secondary memory to keep data stored thereon if the computer system is decoupled from a power source. Examples of the secondary memory include, but are not limited to, hard disk drives (HDDs) and solid-state drives (SSDs). Min-sum is a popular algorithm for identifying and/or correcting bit errors of user data that is stored in the memory with integrity data (e.g., low-density parity-check (LDPC) codes). An LDPC decoder is oftentimes applied to identify and/or correct the bit errors based on the LDPC codes. The LDPC decoder may alternatively apply a sum-product algorithm (SPA) involving complex mathematics of floating point numbers, and can be slow and expensive to implement in silicon-based hardware. It would be beneficial to develop a fast, convenient, and economic solution having a strong error correction power for a memory system.

SUMMARY

Various embodiments of this application are directed to methods, systems, devices, non-transitory computer-readable storage media for delaying updates of check node values at least in part during the course of correcting bit errors using bit flipping in variable nodes. A bit-flipping decoder is applied to flip one bit represented by a variable node at a time, until a codeword having a plurality of bits is corrected. First check node values of the check nodes are used to select a subset of variable nodes to be flipped during an iteration of error correction, and second check node values of the check nodes are used to determine whether a data validity condition is satisfied in response to bit flipping of each variable node. The first check node values are updated with a delayed schedule (e.g., once at the end of the iteration), until an update acceleration condition is satisfied. Conversely, the second check node values are updated immediately after each flipping operation of the variable nodes. Compared with an immediate update, a delayed update of the first check node values results in an increase of bit errors that are corrected. After the update acceleration condition is satisfied, the first check node values are updated with each flipping operation of the variable nodes. As the bit flipping decoder is applied in place of a min-sum based decoder, application of the delayed update of the first check node values helps improve a quality of service (QoS) and reduce power consumption without affecting reliability of a memory device.

In one aspect, a method is implemented at a memory device (e.g., a solid-state drive (SSD)) for correcting errors stored therein. The method includes obtaining a request to validate a block of data stored in the memory device and identifying a set of check nodes corresponding to a set of variable nodes that represent data bits of the block of data. The method further includes determining first check node values of the set of check nodes based on the data bits of the block of data represented by the set of variable nodes and implementing a plurality of iterations of error correction. Implementation of the plurality of iterations of error correction includes flipping a subset of variable nodes successively during each iteration; in response to flipping of each of the subset of variable nodes, determining second check node values of the set of check nodes; and updating the first check node values of the set of check nodes based on the second check node values (1) once in each of a first set of iterations and (2) successively with flipping of each variable node in a second set of iterations following the first set of iterations.

In some embodiments, the method further includes in response to flipping of each variable node, updating the second check node values of the set of check nodes, e.g., during each of the first set of iterations and the second set of iterations.

In some embodiments, implementing the plurality of iterations of error correction further includes, during each iteration, identifying the subset of variable nodes based on the first check node values of the set of check nodes. Each of the subset of variable nodes corresponds to a subset of check nodes that satisfy a node flipping condition.

Some implementations of this application include an electronic device or a memory system. The electronic device or the memory system includes a controller, a memory device coupled to the controller and including local control circuitry, and memory having instructions stored thereon, which when executed by the memory device cause the memory device to perform any of the above methods.

Some implementations of this application include a memory device that includes control circuitry and memory having instructions stored thereon, which when executed by the control circuitry cause the control circuitry to perform any of the above methods.

Some implementations include a non-transitory computer readable storage medium storing one or more programs. The one or more programs include instructions, which when executed by a memory device cause the memory device to implement any of the above methods.

In some embodiments, the above methods, electronic devices, or non-transitory computer readable storage medium for correcting data errors are also used in communication (e.g., wireless communication using 5G or Wi-Fi technology, satellite communications, Ethernet communication, and communication via fiber Optic networks).

These illustrative embodiments and implementations are mentioned not to limit or define the disclosure, but to provide examples to aid understanding thereof. Additional embodiments are discussed in the Detailed Description, and further description is provided there.

BRIEF DESCRIPTION OF THE DRAWINGS

For a better understanding of the various described implementations, reference should be made to the Detailed Description below, in conjunction with the following drawings in which like reference numerals refer to corresponding parts throughout the figures.

Like reference numerals refer to corresponding parts throughout the several views of the drawings.

DETAILED DESCRIPTION

Reference will now be made in detail to specific embodiments, examples of which are illustrated in the accompanying drawings. In the following detailed description, numerous non-limiting specific details are set forth in order to assist in understanding the subject matter presented herein. But it will be apparent to one of ordinary skill in the art that various alternatives may be used without departing from the scope of claims and the subject matter may be practiced without these specific details. For example, it will be apparent to one of ordinary skill in the art that the subject matter presented herein can be implemented on many types of electronic devices using secondary storage.

Various embodiments of this application are directed to methods, systems, devices, non-transitory computer-readable storage media for controlling updates of check node values (e.g., at least partially delaying the updates of check node values) during the course of correcting bit errors using bit flipping in variable nodes. A bit-flipping decoder is applied to flip one bit represented by a variable node at a time, until a codeword having a plurality of bits is corrected. Operation of the bit-flipping decoder is fast and convenient. In some embodiments, the bit-flipping decoder flips a correct bit by mistake and causes a deadlock situation, thereby suffering from a weaker correction power than a min-sum based decoder. In some embodiments, more than one version of check node values of the same check nodes is applied to correct the bit errors associated with the variable nodes, enhancing the correction power of the bit-flipping decoder.

In some embodiments, first check node values of the check nodes are used to select a subset of variable nodes to be flipped during an iteration of error correction, and second check node values of the check nodes are used to determine whether a data validity condition is satisfied in response to bit flipping of each variable node. The first check node values are initially updated with a delayed schedule (e.g., once at the end of the iteration). The update is expedited (e.g., implemented immediately after each flipping operation of a respective variable node), in accordance with a determination that an update acceleration condition is satisfied. Conversely, the second check node values are updated with each flipping operation of the variable nodes. In an example, compared with an expedited update, a delayed update of the first check node values results in an increase of bit errors that are corrected. As the bit flipping decoder is applied in place of a min-sum based decoder, application of the delayed update of the first check node values helps improve a QoS and reduce power consumption without affecting reliability of a memory device.

Figure 1:
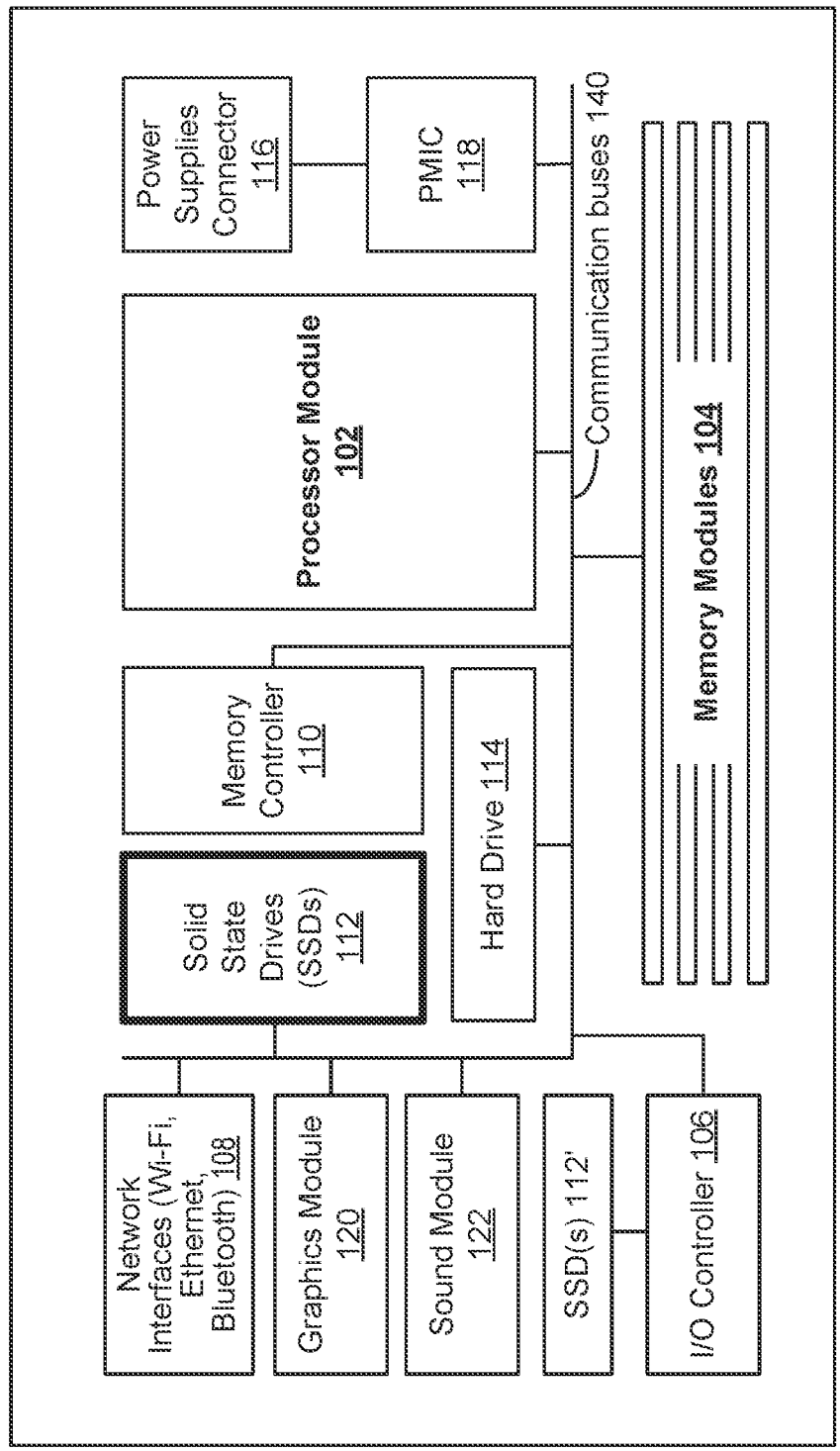
FIG. 1 is a block diagram of an example system module in a typical electronic device in accordance with some embodiments.

FIG. 1 is a block diagram of an example system module 100 in a typical electronic system in accordance with some embodiments. The system module 100 in this electronic system includes at least a processor module 102, memory modules 104 for storing programs, instructions and data, an input/output (I/O) controller 106, one or more communication interfaces such as network interfaces 108, and one or more communication buses 140 for interconnecting these components. In some embodiments, the I/O controller 106 allows the processor module 102 to communicate with an I/O device (e.g., a keyboard, a mouse or a trackpad) via a universal serial bus interface. In some embodiments, the network interfaces 108 includes one or more interfaces for Wi-Fi, Ethernet and Bluetooth networks, each allowing the electronic system to exchange data with an external source, e.g., a server or another electronic system. In some embodiments, the communication buses 140 include circuitry (sometimes called a chipset) that interconnects and controls communications among various system components included in system module 100.

In some embodiments, the memory modules 104 include high-speed random-access memory, such as static random-access memory (SRAM), double data rate (DDR) dynamic random-access memory (DRAM), or other random-access solid state memory devices. In some embodiments, the memory modules 104 include non-volatile memory, such as one or more magnetic disk storage devices, optical disk storage devices, flash memory devices, or other non-volatile solid state storage devices. In some embodiments, the memory modules 104, or alternatively the non-volatile memory device(s) within the memory modules 104, include a non-transitory computer readable storage medium. In some embodiments, memory slots are reserved on the system module 100 for receiving the memory modules 104. Once inserted into the memory slots, the memory modules 104 are integrated into the system module 100.

In some embodiments, the system module 100 further includes one or more components selected from a memory controller 110, SSD(s) 112, an HDD 114, power management integrated circuit (PMIC) 118, a graphics module 120, and a sound module 122. The memory controller 110 is configured to control communication between the processor module 102 and memory components, including the memory modules 104, in the electronic system. The SSD(s) 112 are configured to apply integrated circuit assemblies to store data in the electronic system, and in many embodiments, are based on NAND or NOR memory configurations. The HDD 114 is a conventional data storage device used for storing and retrieving digital information based on electromechanical magnetic disks. The power supply connector 116 is electrically coupled to receive an external power supply. The PMIC 118 is configured to modulate the received external power supply to other desired DC voltage levels, e.g., 5V, 3.3V or 1.8V, as required by various components or circuits (e.g., the processor module 102) within the electronic system. The graphics module 120 is configured to generate a feed of output images to one or more display devices according to their desirable image/video formats. The sound module 122 is configured to facilitate the input and output of audio signals to and from the electronic system under control of computer programs.

Alternatively or additionally, in some embodiments, the system module 100 further includes SSD(s) 112' coupled to the I/O controller 106 directly. Conversely, the SSDs 112 are coupled to the communication buses 140. In an example, the communication buses 140 operates in compliance with Peripheral Component Interconnect Express (PCIe or PCI-E), which is a serial expansion bus standard for interconnecting the processor module 102 to, and controlling, one or more peripheral devices and various system components including components 110-122.

Further, one skilled in the art knows that other non-transitory computer readable storage media can be used, as new data storage technologies are developed for storing information in the non-transitory computer readable storage media in the memory modules 104, SSD(s) 112 or 112', and HDD 114. These new non-transitory computer readable storage media include, but are not limited to, those manufactured from biological materials, nanowires, carbon nanotubes and individual molecules, even though the respective data storage technologies are currently under development and yet to be commercialized.

Some implementations of this application are directed to an error correction process implemented by a memory system (e.g., SSD(s) 112, memory module 104, HDD 114, memory controller 110), which stores codeword symbols including integrity data, e.g., LDPC codes. The integrity check process is also called a decoding process implementing between variable nodes and check nodes. The variable nodes correspond to the codeword symbols extracted from the memory system. Each check node corresponds to a distinct set of variable nodes, and has check node data configured to identify and/or correct bit errors in the codeword symbols corresponding to the distinct set of variable nodes.

Figure 2:
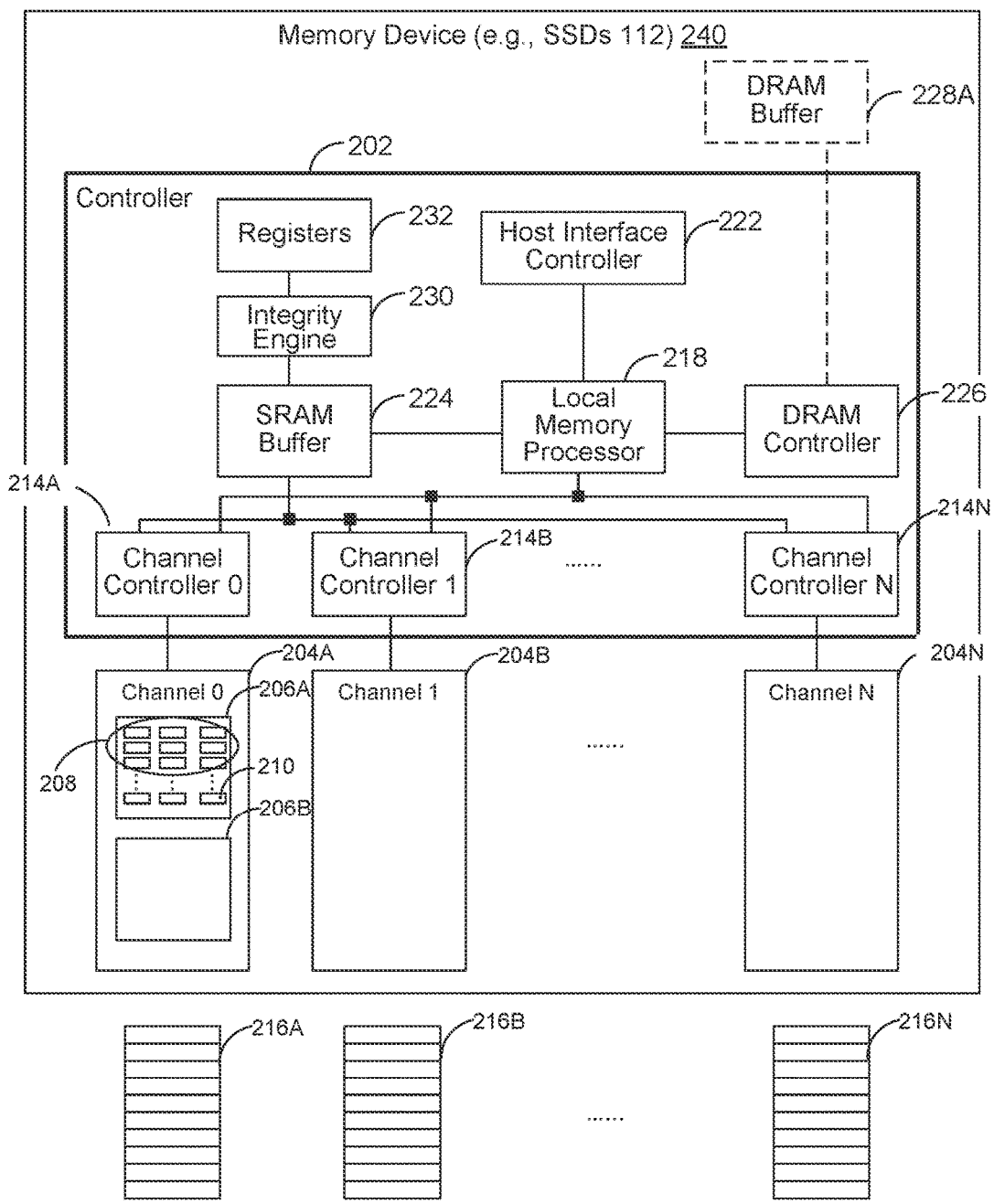
FIG. 2 is a block diagram of a memory system of an example electronic device having one or more memory access queues, in accordance with some embodiments.

FIG. 2 is a block diagram of a memory system 200 of an example electronic device having one or more memory access queues, in accordance with some embodiments. The memory system 200 is coupled to a host device 220 (e.g., a processor module 102 in FIG. 1) and configured to store instructions and data for an extended time, e.g., when the electronic device sleeps, hibernates, or is shut down. The host device 220 is configured to access the instructions and data stored in the memory system 200 and process the instructions and data to run an operating system and execute user applications. The memory system 200 includes one or more memory devices 240 (e.g., SSD(s)). Each memory device 240 further includes a controller 202 and a plurality of memory channels 204 (e.g., channel 204A, 204B, and 204N). Each memory channel 204 includes a plurality of memory cells. The controller 202 is configured to execute firmware level software to bridge the plurality of memory channels 204 to the host device 220. In some embodiments, each memory device 240 is formed on a printed circuit board (PCB).

Each memory channel 204 includes on one or more memory packages 206 (e.g., two memory dies). In an example, each memory package 206 (e.g., memory package 206A or 206B) corresponds to a memory die. Each memory package 206 includes a plurality of memory planes 208, and each memory plane 208 further includes a plurality of memory pages 210. Each memory page 210 includes an ordered set of memory cells, and each memory cell is identified by a respective physical address. In some embodiments, the memory device 240 includes a plurality of superblocks. Each superblock includes a plurality of memory blocks each of which further includes a plurality of memory pages 210. For each superblock, the plurality of memory blocks are configured to be written into and read from the memory system via a memory input/output (I/O) interface concurrently. Optionally, each superblock groups memory cells that are distributed on a plurality of memory planes 208, a plurality of memory channels 204, and a plurality of memory dies 206. In an example, each superblock includes at least one set of memory pages, where each page is distributed on a distinct one of the plurality of memory dies 206, has the same die, plane, block, and page designations, and is accessed via a distinct channel of the distinct memory die 206. In another example, each superblock includes at least one set of memory blocks, where each memory block is distributed on a distinct one of the plurality of memory dies 206 includes a plurality of pages, has the same die, plane, and block designations, and is accessed via a distinct channel of the distinct memory die 206. The memory device 240 stores information of an ordered list of superblocks in a cache of the memory device 240. In some embodiments, the cache is managed by a host driver of the host device 220, and called a host managed cache (HMC).

In some embodiments, the memory device 240 includes a single-level cell (SLC) NAND flash memory chip, and each memory cell stores a single data bit. In some embodiments, the memory device 240 includes a multi-level cell (MLC) NAND flash memory chip, and each memory cell of the MLC NAND flash memory chip stores 2 data bits. In an example, each memory cell of a triple-level cell (TLC) NAND flash memory chip stores 3 data bits. In another example, each memory cell of a quad-level cell (QLC) NAND flash memory chip stores 4 data bits. In yet another example, each memory cell of a penta-level cell (PLC) NAND flash memory chip stores 5 data bits. In some embodiments, each memory cell can store any suitable number of data bits. Compared with the non-SLC NAND flash memory chips (e.g., MLC SSD, TLC SSD, QLC SSD, PLC SSD), the SSD that has SLC NAND flash memory chips operates with a higher speed, a higher reliability, and a longer lifespan, and however, has a lower device density and a higher price.

Each memory channel 204 is coupled to a respective channel controller 214 (e.g., controller 214A, 214B, or 214N) configured to control internal and external requests to access memory cells in the respective memory channel 204. In some embodiments, each memory package 206 (e.g., each memory die) corresponds to a respective queue 216 (e.g., queue 216A, 216B, or 216N) of memory access requests. In some embodiments, each memory channel 204 corresponds to a respective queue 216 of memory access requests. Further, in some embodiments, each memory channel 204 corresponds to a distinct and different queue 216 of memory access requests. In some embodiments, a subset (less than all) of the plurality of memory channels 204 corresponds to a distinct queue 216 of memory access requests. In some embodiments, all of the plurality of memory channels 204 of the memory device 240 corresponds to a single queue 216 of memory access requests. Each memory access request is optionally received internally from the memory device 240 to manage the respective memory channel 204 or externally from the host device 220 to write or read data stored in the respective channel 204. Specifically, each memory access request includes one of: a system write request that is received from the memory device 240 to write to the respective memory channel 204, a system read request that is received from the memory device 240 to read from the respective memory channel 204, a host write request that originates from the host device 220 to write to the respective memory channel 204, and a host read request that is received from the host device 220 to read from the respective memory channel 204. It is noted that system read requests (also called background read requests or non-host read requests) and system write requests are dispatched by a memory controller to implement internal memory management functions including, but are not limited to, garbage collection, wear levelling, read disturb mitigation, memory snapshot capturing, memory mirroring, caching, and memory sparing.

In some embodiments, in addition to the channel controllers 214, the controller 202 further includes a local memory processor 218, a host interface controller 222, an SRAM buffer 224, and a DRAM controller 226. The local memory processor 218 accesses the plurality of memory channels 204 based on the one or more queues 216 of memory access requests. In some embodiments, the local memory processor 218 writes into and read from the plurality of memory channels 204 on a memory block basis. Data of one or more memory blocks are written into, or read from, the plurality of channels jointly. No data in the same memory block is written concurrently via more than one operation. Each memory block optionally corresponds to one or more memory pages. In an example, each memory block to be written or read jointly in the plurality of memory channels 204 has a size of 16 KB (e.g., one memory page). In another example, each memory block to be written or read jointly in the plurality of memory channels 204 has a size of 64 KB (e.g., four memory pages). In some embodiments, each page has 16 KB user data and 2 KB metadata. Additionally, a number of memory blocks to be accessed jointly and a size of each memory block are configurable for each of the system read, host read, system write, and host write operations.

In some embodiments, the local memory processor 218 stores data to be written into, or read from, each memory block in the plurality of memory channels 204 in an SRAM buffer 224 of the controller 202. Alternatively, in some embodiments, the local memory processor 218 stores data to be written into, or read from, each memory block in the plurality of memory channels 204 in a DRAM buffer 228A that is included in memory device 240, e.g., by way of the DRAM controller 226. Alternatively, in some embodiments, the local memory processor 218 stores data to be written into, or read from, each memory block in the plurality of memory channels 204 in a DRAM buffer 228B that is main memory used by the processor module 102 (FIG. 1). The local memory processor 218 of the controller 202 accesses the DRAM buffer 228B via the host interface controller 222.

Figure 3:
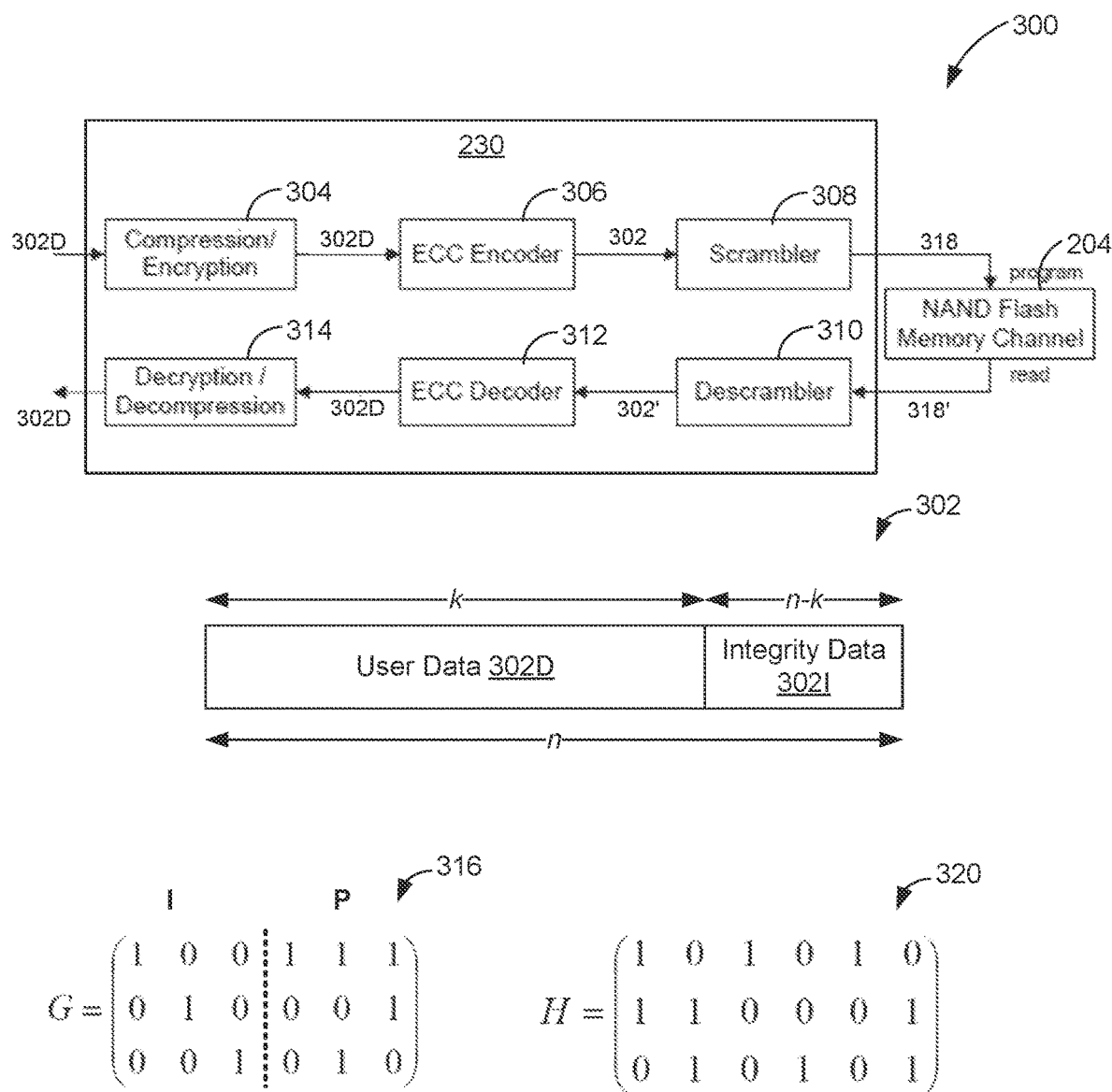
FIG. 3 is a block diagram of an example integrity check system of a memory system for processing a codeword, in accordance with some embodiments.

In some embodiments, data in the plurality of memory channels 204 is grouped into coding blocks, and each coding block is called a codeword (e.g., 302 in FIG. 3). For example, each codeword includes n bits among which k bits correspond to user data and (n-k) corresponds to integrity data of the user data, where k and n are positive integers. In some embodiments, the memory device 240 includes an integrity engine 230 (e.g., an LDPC engine) and registers 232, which include a plurality of registers or SRAM cells or flip-flops and are coupled to the integrity engine 230. The integrity engine 230 is coupled to the memory channels 204 via the channel controllers 214 and SRAM buffer 224. Specifically, in some embodiments, the integrity engine 230 has data path connections to the SRAM buffer 224, which is further connected to the channel controllers 214 via data paths that are controlled by the local memory processor 218. The integrity engine 230 is configured to verify data integrity and correct bit errors for each coding block of the memory channels 204.

FIG. 3 is a block diagram of an example integrity check system 300 of a memory system 200 for processing a codeword 302, in accordance with some embodiments. The integrity check system 300 includes a plurality of memory channels 204, an integrity engine 230 (e.g., an LDPC engine), and a registers 232. Data stored in memory channels 204 of the memory system 200 (FIG. 2) is grouped into blocks of data, and each block of data 302 is called a codeword 302. Each codeword 302 further includes n data bits among which k data bits are user data 302D and (n-k) data bits are integrity data 302I of the user data 302D, where k and n are positive integers. The integrity check system 300 is configured to verify data integrity for each codeword 302 of the memory channels 204.

In some embodiments, the integrity engine 230 further includes one or more of: a compression module 304, an error correction code (ECC) encoder 306, a scrambler 308, a descrambler 310, an ECC decoder 312, and a decompression module 314. The compression module 304 obtains user data 302D and processes (e.g., compresses, encrypts) the user data 302D. The ECC encoder 306 obtains the user data 302D that is optionally processed by the compression module 304, and applies a parity data generation matrix G (316) on the user data 302D to encode the codeword 302. The matrix G (316) has k rows and n columns. A systematic form of the matrix G includes an identify matrix I configured to preserve the user data 302D within the codeword 302 and a parity matrix P configured to generate the integrity data 302I from the user data 302D. In some embodiments, the matrix G (316) is not unique and includes a set of basis vectors for a vector space of valid codewords 302. The scrambler 308 obtains the codeword 302 including n data bits and converts the n data bits to a scrambled codeword 318 having a seemingly random output string of n data bits. The scrambled codeword 318 is stored in the memory channels 204 of the memory system 200.

During decoding, a scrambled codeword 318' is extracted from the memory channel 204 of the memory system 200. The descrambler 310 recovers a codeword 302' from the extracted codeword 318', and the ECC decoder 312 verifies whether the recovered codeword 302' is valid and corrects erroneous bits in the recovered codeword 302, thereby providing the valid codeword 302 including the valid user data 302D. In some embodiments, the decompression module 314 obtains the user data 302D and processes (e.g., decompresses, decrypts) the user data 302D. In some embodiments, for integrity check, the ECC decoder 312 applies a parity-check matrix H (320) on the recovered codeword 302' to generate a syndrome vector S. The parity check matrix H (320) includes n−k rows corresponding to n-k parity check equations and n columns corresponding to n codeword bits. A relationship of the recovered codeword 302' and the syndrome vector s is represented as follows:

$$S = yH^T \quad (1)$$

where y is the recovered codeword 302'. In some embodiments, in accordance with a determination that the syndrome s is equal to 0, the ECC decoder 312 determines that all parity-check equations associated with the parity-check matrix H are satisfied and that the recovered codeword 302' is valid. Conversely, in accordance with a determination that the syndrome is not equal to 0, the ECC decoder 312 determines that at least a predefined number (e.g., one, two) parity check equation associated with the parity-check matrix H is not satisfied and that the recovered codeword 302' is not valid. Alternatively, in some embodiments, the ECC decoder 312 operates to solve the following equation:

$$S = eH^T \qquad (2)$$

where e is an error vector. The syndrome vector s is a combination of the error vector e and a valid codeword 302. Given that the syndrome vector s and the parity check matrix H are known, the ECC decoder 312 solves equation (2) to obtain the error vector e and identify the erroneous bits in the recovered codeword 302'.

Figure 4:
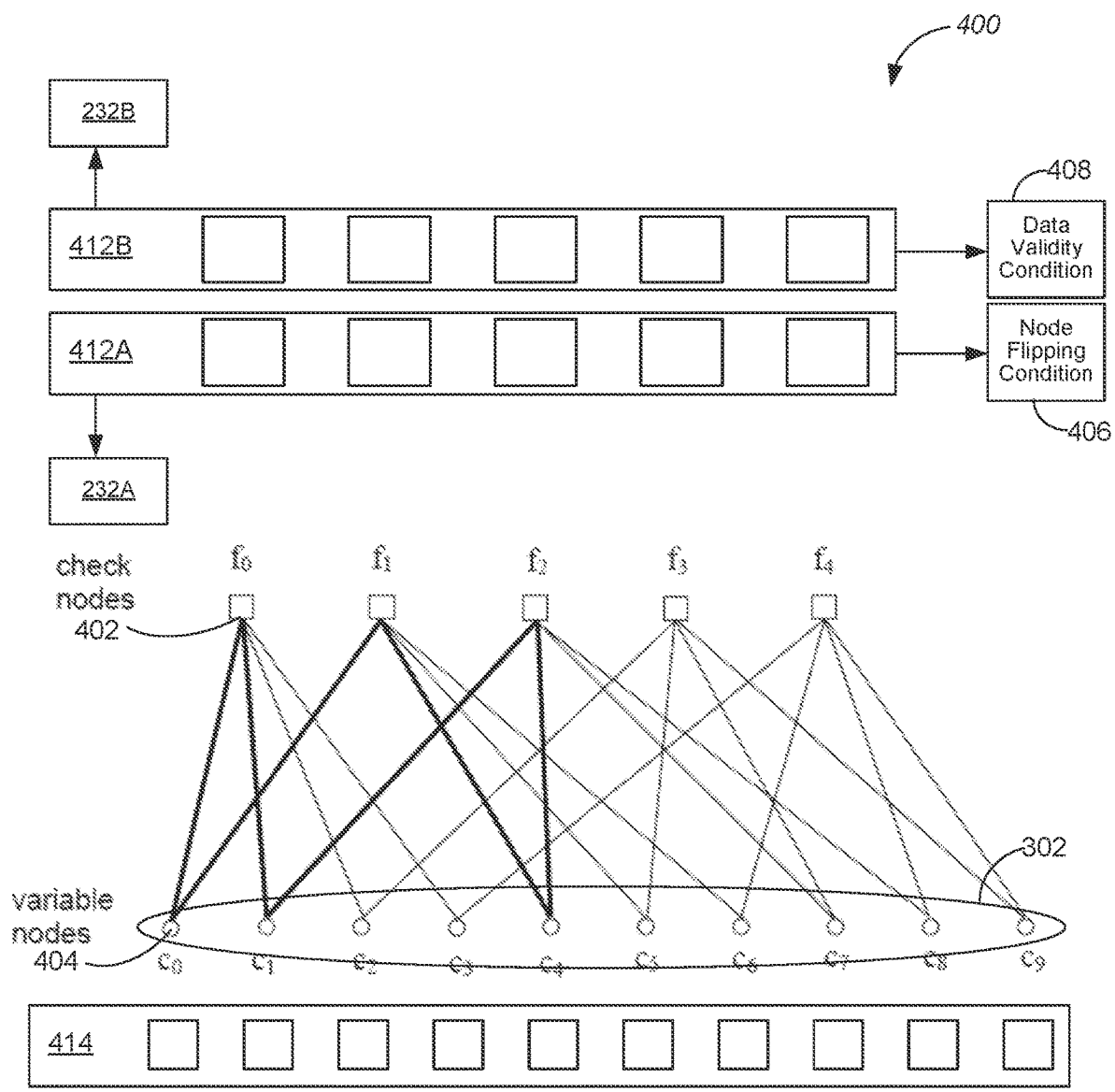
FIG. 4 is a Tanner graph applied to implement LDPC coding using check nodes and variable nodes, in accordance with some embodiments.

FIG. 4 is a Tanner graph 400 applied to implement LDPC coding using check nodes 402 and variable nodes 404, in accordance with some embodiments. Data stored in a memory system 200 (FIG. 2) is verified on a codeword basis. Each codeword 302 includes n data bits among which k data bits are user data 302D and n–k data bits are integrity data 302I of the user data 302D, where k and n are positive integers. In some embodiments, the parity check matrix H (320) is applied without differentiating the user data 302D and the integrity data 302I during integrity check. The parity-check matrix H (320) includes n–k rows corresponding to n–k parity-check equations and n columns corresponding to n codeword bits, where k and n are positive integers. Each parity-check equation combines corresponding n codeword bits (also called codeword symbols), and therefore, corresponds to a check node 402 that is connected up to a subset or all of the n variable nodes 404. In some embodiments, only j codeword bits in the n codeword bits correspond to 1 in the parity check matrix H (320) for a row corresponding to check node 402, where j is an integer less than n, and the check node 402 is connected to the j variable nodes 404. In some embodiments, each and every check node 402 is connected to the same number of variable nodes 404 (e.g. j variable nodes 404). Alternatively, in some embodiments, each check node 402 is connected to a respective number of variable nodes 404, and at least two check nodes 402 are connected to different numbers of variable nodes 404.

Referring to FIG. 4, in this example, the codeword 302 has 10 codeword symbols (also called codeword bits). Five parity check equations are applied to do integrity check on the codeword 302, and each parity check equation is applied on a set of four codeword symbols (j=4). As such, the Tanner graph 400 includes five check nodes 402 ($f_0$-$f_4$) and each check node 402 is connected to four respective variable nodes 404 each corresponding to a distinct set of four codeword symbols of the codeword 302. Each variable node 404 is used in two parity check equations to determine two check nodes 402, and therefore, has a degree equal to two. In other words, each variable node 404 is a vertex in the Tanner Graph that is connected to two edges.

In some embodiments, the ECC decoder 312 solves equation (2) to obtain the error vector e and identify one or more erroneous bits in the codeword 302 by an iterative integrity check process. Messages are exchanged between the variable nodes 404 and check nodes 402 on the Tanner graph 400 until the one or more erroneous bits are identified or corrected in the codeword 302. Each variable node 404 is assigned with initial variable node data. In some embodiments, the initial variable node data includes a log-likelihood ratio (LLR) that is determined based on data measured when a read reference voltage is adjusted for the memory system 200. Each check node 402 is connected to a set of variable nodes 404, and receives messages including the initial variable node data from the set of variable nodes 404. For each check node 402, the check node data is determined based on the initial variable node data of the set of variable nodes 404, and indicates a likelihood of a set of codeword symbols corresponding to the set of variable nodes 404 being erroneous. Conversely, each variable node 404 is also connected to a set of check nodes 402 on the Tanner graph 400, and receives messages including the check node data from the set of check nodes 402. For each variable node 404, variable node data is updated based on the check node data of the set of variable nodes 404. By these means, the messages are exchanged between the check nodes 402 and variable nodes 404 until a data validity condition is satisfied, and the one or more erroneous bits are identified or corrected based on the variable node data or the check node data. In some embodiments, the data validity condition is satisfied when the check node data is 0 for all check nodes 402.

In some embodiments, the ECC decoder 312 includes a bit-flipping decoder configured to flip each of the variable nodes 404 that satisfy a node flipping condition 406 successively during a plurality of iterations of error correction. Variable node values 414 of the variable nodes 404 are provided to their connected check nodes 402 on the Tanner graph 400 to determine check node values 412A and 412B of the check nodes 402, which are further used to determine whether a data validity condition 408 is satisfied. Each variable node 404 is assigned with an initial variable node value 414 that is equal to a respective bit value of the codeword 302. Each check node 402 is connected to a set of variable nodes 404, and receives variable node values 414 including the initial variable node values from the set of variable nodes 404. For each check node 402, a first check node value 412A is determined based on the initial variable node data of the set of variable nodes 404, e.g., using an XOR logic, and indicates whether a set of codeword symbols corresponding to the set of variable nodes 404 includes any erroneous bit. For example, the first check node value 412A is equal to a first value (e.g., "0"), indicating that the set of variable nodes 404 connected to the respective check node 402 does not include any erroneous bit, and the check node value 412A is equal to a second value (e.g., "1"), indicating that the set of variable nodes 404 connected to the respective check node 402 includes one or more erroneous bits.

Each variable node 404 is also connected to a set of check nodes 402 on the Tanner graph 400. First check node values 412A of the plurality of check nodes 402 are determined based on the initial variable node values 414 of the variable nodes 404, and further used to select a subset of variable nodes 404 that satisfy a node flipping condition. For example, a portion of the first check node values 412A of each of the subset of check nodes has the second value (e.g., "1") indicating existence of a data error, and in accordance with the node flipping condition 406, each of the subset of variable nodes 404 is configured to flip in accordance with a determination that the portion is greater than a predefined error limit (e.g., 50%, 65%, 80%). An iteration of error correction is implemented to flip the subset of variable nodes 404 successively. During the iteration, in response to flipping of each of the subset of variable nodes 404, second check node values 412B of the plurality of check nodes 402 are updated and used to determine whether the data validity condition 408 is satisfied (e.g., whether all of the second check node values 412B are equal to the first value (e.g., "0") indicating correct data). At the end of the iteration, the first check node values 412A are updated with the second check node values 412B, and applied to select a subset of variable nodes 404 to be flipped during a next iteration. Additionally, after one or more iterations, the first check node values 412A are updated with the second check node values 412B jointly in response to flipping of each variable node 404 to accelerate the iterations of error correction, thereby expediting the iterations of error correction. The bit-flipping decoder terminates these iterations, in accordance with a determination that the check nodes 402 satisfy the data validity condition 408 or that erroneous bits are not correctable in the variable nodes 404.

In some embodiments, the first check node values 412A and the second check node values 412B of the check nodes 402 are stored in two distinct sets of registers 232A and 232B (e.g., of registers 232 in FIG. 2).

FIGS. 5A-5F are node diagrams 500, 510, 520, 530, 540, and 550 illustrating an example process of error correction in a memory device 240, in accordance with some embodiments. This example process of error correction includes two iterations 502 and 504 of error correction. A codeword 302 includes a block of data 302. A request is obtained by the memory device (e.g., a controller 202) to validate the block of data 302 stored in the memory device including correcting data errors in the block of data 302. A set of check nodes 402 corresponds to a set of variable nodes 404 that represent data bits of the block of data 302. For brevity, three variable nodes 404A, 404B, and 404C and six check nodes 402A to 402F are shown on FIGS. 5A-5F. Each check node 402 corresponds to a subset of respective variable nodes 404 that corresponds to the respective check node 402, and the subset of respective variable nodes 404 are combined to determine a check node value 412A or 412B of the respective check node 402. In some embodiments, the subset of variable nodes 404 corresponding to a check node 402 (e.g., check node 402A, 402D, or 402F) includes a single variable node 404, the check node value 412 or 412B of the respective check node is set according to a data bit represented by the single variable node 404. Alternatively, in some embodiments, in accordance with a determination the subset of variable nodes 404 corresponding to a check node 402 (e.g., check node 402B, 402C, or 402E) includes more than one variable node 404, an XOR based logic is applied to combine the subset of variable nodes 404 to determine the check node value 412A or 412B of the check node 402.

Figure 5A:
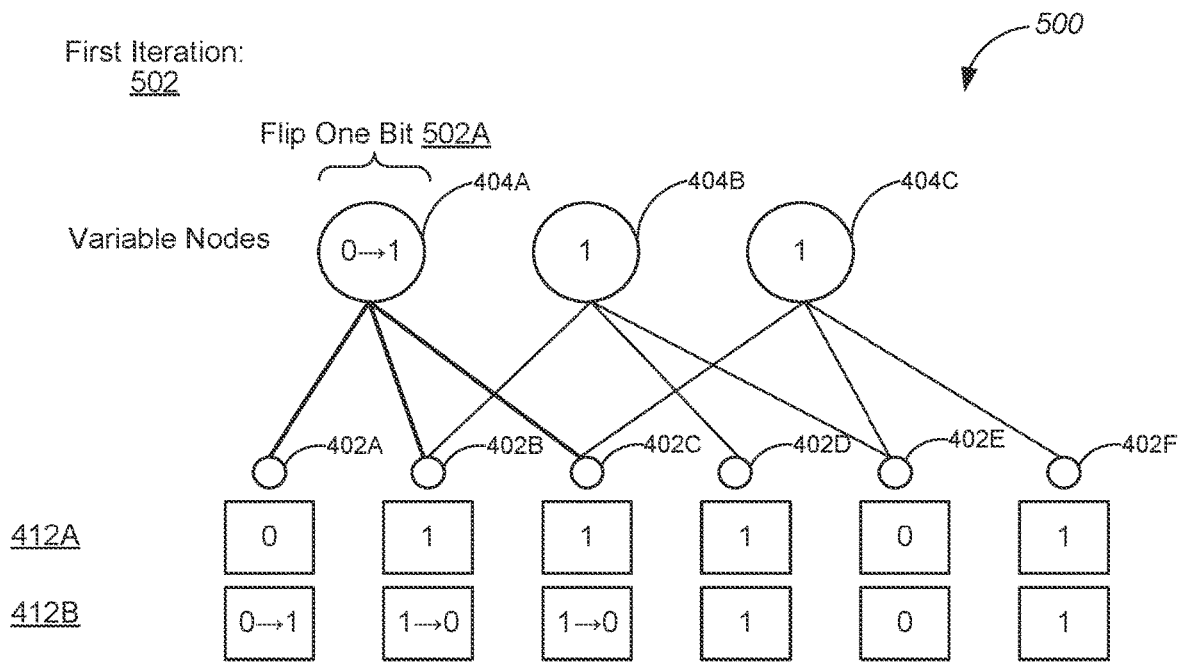
FIGS. 5A-5F are node diagrams illustrating an example process of error correction in a memory device, in accordance with some embodiments.

An example node flipping condition 406 requires that a variable node 404 flip in accordance with a determination that a portion of the first check node values 412A equal to "1" is greater than a predefined error limit (e.g., >50%, 60%, or >80%). Referring to FIG. 5A, in an example, initial variable node values of the variable nodes 404A to 404C are "0," "1," and "1," respectively. The first check node values 412A of the check nodes 402A to 402F are determined to be "0," "1," "1," "1," "0," and "1," respectively, so are the second check node values 412B. Each of the variable nodes 404A, 404B, and 404C is connected to three respective check nodes, two of which are equal to "1" indicating existence of a data error in their associated variable nodes 404. In accordance with the example node flipping condition 406, all of the variable nodes 404A-404C are flipped successively (e.g., as shown in FIGS. 5A, 5B, and 5C) during a first iteration 502.

Referring to FIG. 5A, in response to flipping of the variable node 404A (operation 502A), the second check node values 412B of the set of check nodes 402 are updated to "1," "0," "0," "1," "0," and "1," and particularly the second check node values 412B of the check nodes 402A, 402B, and 402C are flipped with the variable node 404A. Referring to FIG. 5B, further in response to flipping of the variable node 404B (operation 502B), the second check node values 412B of the set of check nodes 402 are updated to "1," "1," "0," "0," "1," and "1," and particularly the second check node values 412B of the check nodes 402B, 402D, and 402E are flipped with the variable node 404B. Referring to FIG. 5C, further in response to flipping of the variable node 404C (operation 502C), the second check node values 412B of the set of check nodes 402 are updated to "1," "1," "1," "0," "0," and "0," and particularly the second check node values 412B of the check nodes 402C, 402E, and 402F are flipped again with the variable node 404C.

During the first iteration 502 of error correction, all variable nodes 402A-402C satisfy the example node flipping condition 406 and are flipped. The second check node values 412B of the set of check nodes 402 are updated in response to flipping of each variable node 402. The first check node values 412A of the set of check nodes 402 are initially determined based on the initial variable node data 414 of the variable nodes 404, and applied to identify the variable nodes 402 to be flipped based on the node flipping condition 406. The first check node values 412A of the set of check nodes 402 are then updated once based on the second check node values 412B at the end of the first iteration 502 (e.g., in FIGS. 5A-5C). For example, referring to FIG. 5D, the first check node values 412A of the set of check nodes 402 are updated once based on the second check node values 412B after all of the identified variable nodes 404 flip in this first iteration 502.

Figure 5B:
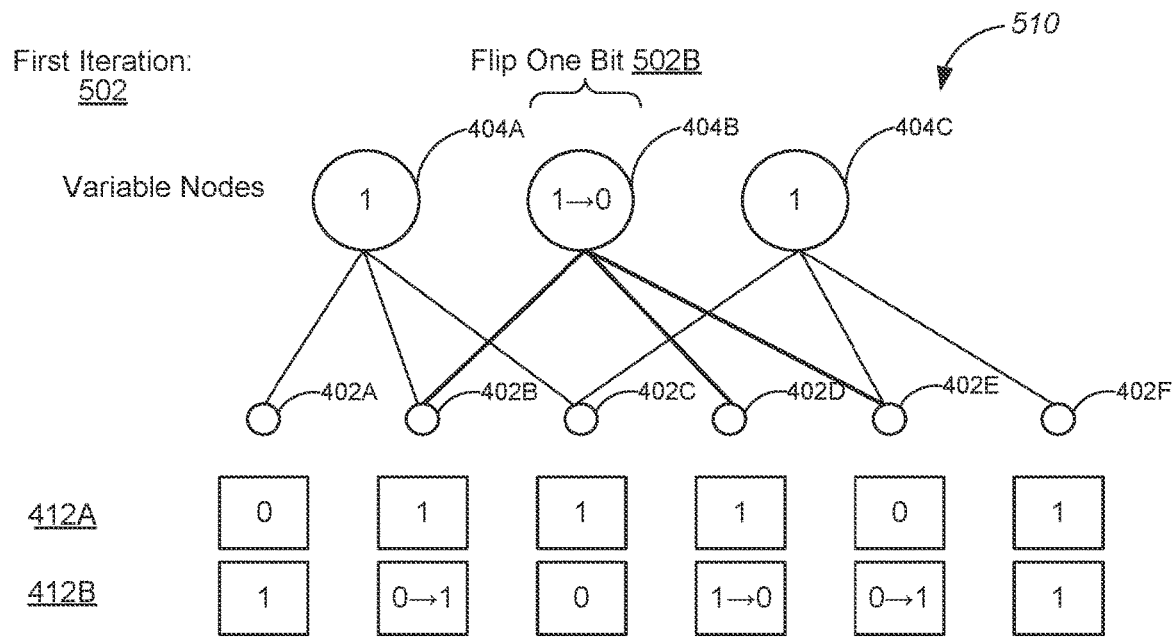
Figure 5C:
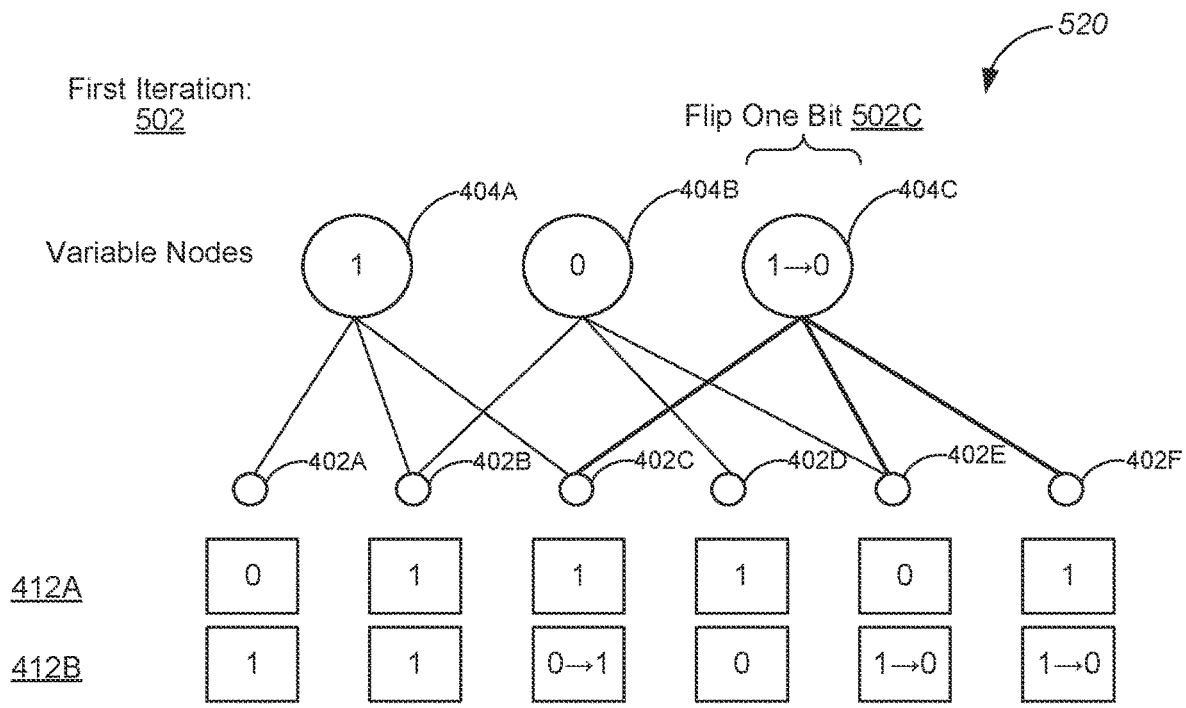
Figure 5D:
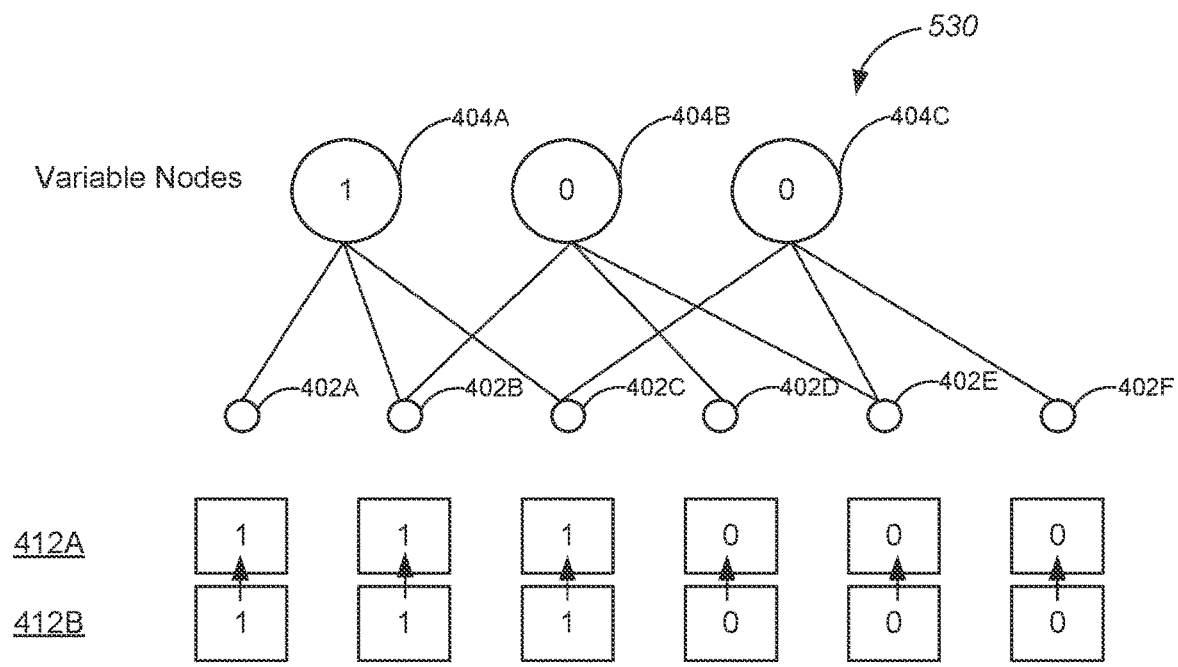

In some embodiments, the above example node flipping condition 406 is applied to select a subset of variable nodes 404 to be flipped during a second iteration 504 based on the first check node values 412A of the set of check nodes 402 updated during the first iteration 502 (e.g., in FIGS. 5A-5C). The node flipping condition 406 requires that a portion of the first check node values 412A, which correspond to each selected variable node 404 and are equal to "1," is greater than a predefined error limit (e.g., >50%). Referring to FIG. 5D, after variable node flipping in the first iteration 502, the variable node values of the variable nodes 404A to 404C are "1," "0," and "0," respectively. The first check node values 412A of the check nodes 402A to 402F are updated to "1," "1," "1," "0," "0," and "0," respectively, so are the second check node values 412B. The variable node 404A is connected to three check nodes 402A-402C that are all equal to "1," and satisfies the node flipping condition 406. Conversely, either one of the variable nodes 404B and 404C is connected to three respective check nodes only one of which is equal to "1," and does not satisfy the node flipping condition 406. In accordance with the example node flipping condition 406, the variable node 404A is flipped (e.g., as shown in FIG. 5E) during a second iteration 504 that immediately follows the first iteration 502.

Figure 5E:
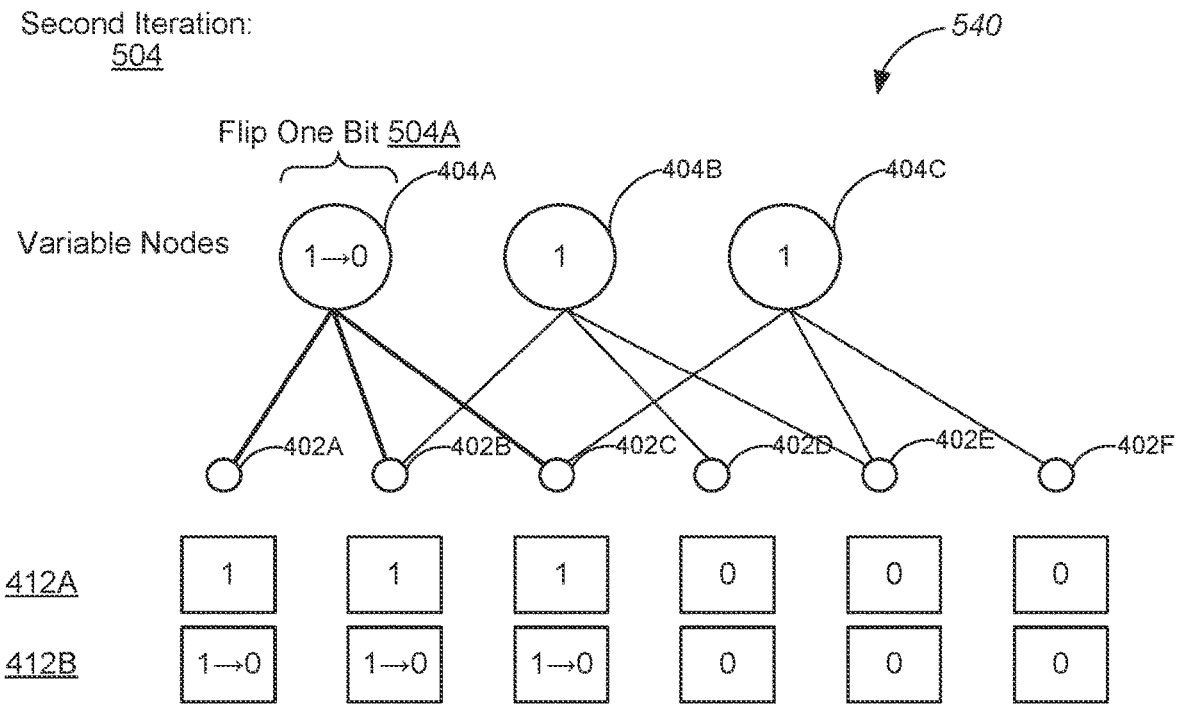
Figure 5F:
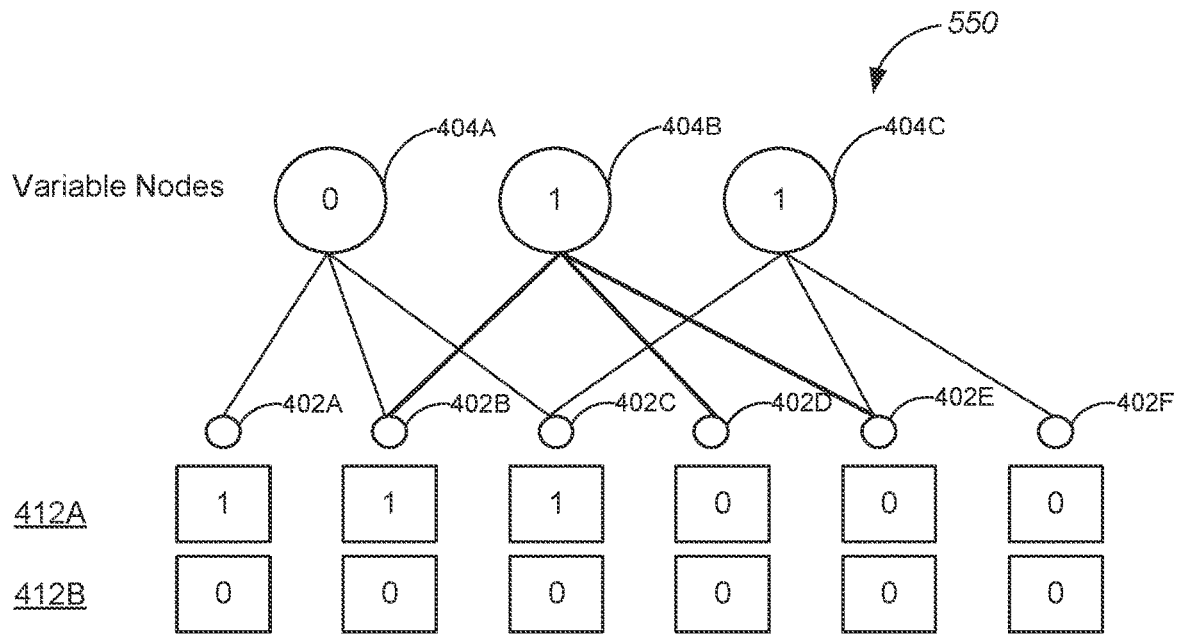

Referring to FIG. 5E, in response to flipping of the variable node 404A (operation 504A), the second check node values 412B of the set of check nodes 402 are updated to "0," "0," "0," "0," "0," and "0," and particularly the second check node values 412B of the check nodes 402A, 402B, and 402C are flipped with the variable node 404A. During the second iteration 504 of error correction, only the variable node 404A satisfies the example node flipping condition 406 and is flipped. Referring to FIG. 5F, the second check node values 412B of the set of check nodes 402 are updated in response to flipping of each variable node 402. The updated second check node values 412B satisfy a data validity condition 408 (FIG. 4), e.g., which requires an XOR-based combination of the second check node values 412B is equal to the predefined first value (e.g., "0"), indicating that corresponding variable nodes 404A-404C are free of errors. In accordance with a determination that the second check node values 412B of the set of check nodes 402A to 402F satisfy the data validity condition 408, the memory device 240 terminates the plurality of iterations of error correction.

In some embodiments, after terminating the plurality of iterations, the memory device 240 disclaims the block of data 302 that was originally stored in the memory device 240, and rewrites the data bits of the set of variable nodes 404 that has been corrected for use as the block of data 302. Further, in some embodiments, the data bits of the set of variable nodes 404 that has been corrected are stored in a physical address distinct from that of the block of data 302 that was originally stored in the memory device 240. Alternatively, in some embodiments, the data bits of the set of variable nodes 404 that has been corrected are stored in the same physical address to overwrite the block of data 302 that was originally stored in the memory device 240.

In some embodiments not shown, the process of error correction is terminated without satisfying the data validity condition 408. In accordance with a determination that a number of iterations implemented prior to a final iteration reaches a predefined iteration limit, the memory device 240 terminates the plurality of iterations, and returns a message indicating that errors in the block of data 302 are uncorrectable. In an example, the predefined iteration limit is 60 iterations. After 60 iterations, the memory device 240 decides that bit flipping may never end and could be insufficient to correct errors in the block of data 302.

Referring to FIG. 5A-5F, in some embodiments of this application, the first check node values 412A of the check nodes 402 are used to select a subset of variable nodes 404 to be flipped during each iteration of error correction, and the second check node values 412B of the check nodes 402 are used to determine whether the data validity condition 408 is satisfied in response to bit flipping of each variable node 404. The second check node values are updated immediately after each flipping operation of the variable nodes. During at least the first iteration 502, the first check node values 412A are not updated immediately after each flipping operation of the variable nodes, and instead, are updated with a delayed schedule (e.g., once at the end of the first iteration 502 in FIG. 5D). Each variable node 404 is evaluated based on older versions of the check nodes 402, allowing multiple bits to flip independently and reducing an impact of bad flips. Compared with an immediate update, a delayed update of the first check node values 412 results in an increase of bit errors that are corrected. Application of the delayed update of the first check node values 412A helps improve a QoS and reduce power consumption without affecting reliability of the memory device 240.

Figure 6A:
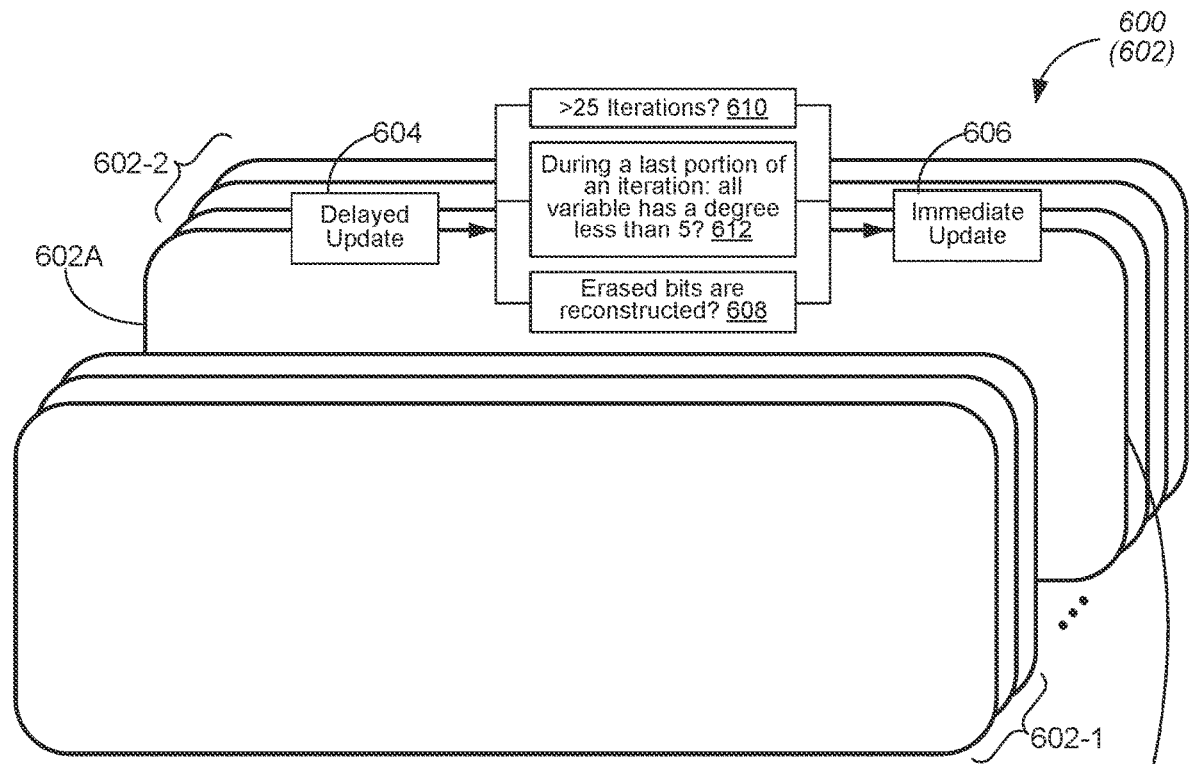
FIG. 6A is a diagram illustrating an example process of correcting errors in a block of data stored in a memory device, in accordance with some embodiments.
Figure 6A:
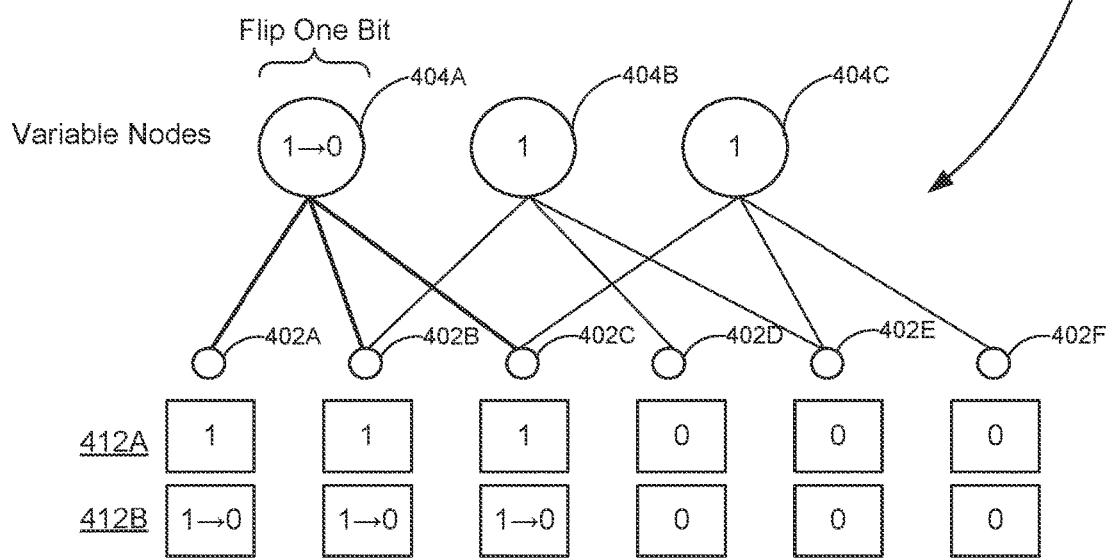

FIG. 6A is a diagram illustrating an example process 600 of correcting errors in a block of data 302 stored in a memory device 240, in accordance with some embodiments. The process 600 includes a plurality of iterations 602 of error corrections, and a combination of delayed and immediate updates of first check node values 412A is applied to implement the process 600. During a first set of iterations 602-1 (e.g., the first iteration 502 in FIGS. 5A-5C), the first check node values 412A are updated with a delayed schedule (e.g., once at a start, an intermediate point, or an end of each iteration). During a second set of iterations 602-2 that follows the first set of iterations, the first check node values 412A are updated immediately in response to each flipping operation of the variable nodes 404. In some embodiments, in accordance with a determination that the iterations 602 of error correction satisfy an update acceleration condition is satisfied, the immediate update is enabled to allow the first check node values 412A to be updated with each flipping operation of the variable nodes 404.

During an iteration 602A, a subset of variable nodes 404 are successively flipped. In some embodiments, the subset of variable nodes 404 include all variable nodes 404 corresponding to the block of data 302 stored in the memory device 240. Alternatively, in some embodiments, the subset of variable nodes 404 include less than all variable nodes 404 (e.g., a single variable node 404A in the second iteration 504 in FIG. 5E) corresponding to the block of data 302 stored in the memory device 240. In response to flipping of each of the subset of variable node 404, the memory device 240 determines and updates the second check node values 412B of the set of check nodes 402 corresponding to the variable nodes 404. In some embodiments, the memory device 240 reconstructs (condition 608) a subset of the block of data 302 that have been erased and are represented by the variable nodes 404. Successively in response to flipping of each variable node 404, the first check node values 412A of the set of check nodes 402 are immediately updated (operation 606) with the second check node values 412B determined for the set of check nodes 402, e.g., during the rest of the iteration 602A and the second set of iterations 602-2 following the iteration 602A.

In some embodiments, prior to the iteration 602A, the first check node values 412A of the set of check nodes 402 are updated (operation 604) based on the second check node values 412B once in each of the first set of iterations 602-1. In some situations, a small power spike is induced, when the first check node values 412A are updated during each iteration 602-1. Further, in some embodiments, during the iteration 602A, the memory device 240 determines that the iteration 602A has a number of iterations that are implemented immediately prior to the iteration 602A in the plurality of iterations 602. In accordance with a determination (condition 610) that the number of iterations is greater than a predefined iteration number (e.g., 25, 30), successively in response to flipping of each following variable node 404, the memory device updates the first check node values 412A of the set of check nodes 402 with the second check node values 412B determined for the set of check nodes 402, e.g., during the rest of the iteration 602A and the second set of iterations 602-2 following the iteration 602A. In an example, after 25 iterations of delayed update, the first check node values 412A are determined and updated jointly with the second check node values 412B at each variable node flip.

Alternatively, in some embodiments, at a current time during the iteration 602A, the memory device 240 identifies, in the subset of variable nodes that are flipped, a plurality of variable nodes 404 that flip prior to the current time and during a portion of the iteration 602A, and determines that each of the plurality of variable nodes 404 has a degree (e.g., equal to 1, 2, or 3) that is less than a predefined degree number (e.g., 4). In accordance with a determination (condition 612) that each of the plurality of variable nodes 404 has the degree less than the predefined degree number, successively in response to flipping of each following variable node, the memory device 240 updates the first check node values 412A of the set of check nodes 402 with the second check node values 412B determined for the set of check nodes 402, e.g., during the rest of the iteration 602A and the second set of iterations 602-2 following the iteration 602A. In an example, if there has not been a flip of a variable node 404 with a degree greater than 4 (i.e., connected to 5 or more check nodes 402) in the last half iteration, the first check node values 412A are determined and updated jointly with the second check node values 412B at each variable node flip.

Additionally and alternatively, in some embodiments, the immediate update 606 of the first check node values 412A is implemented successively in response to flipping of each variable node 404, in accordance with a determination (1) that the number of iterations implemented immediately prior to the iteration 602A is greater than a predefined iteration number (e.g., 25, 30) or (2) that each of the plurality of variable nodes 404 flipped during a past portion of the iteration 602A has the degree less than the predefined degree number (e.g., under condition 610 or 612). For example, if there has not been a flip of a variable node 404 with degree >4 (high variable node degree) in the last iteration, or if the first set of iterations 602-1 already includes the last 30 iterations, the first check node values 412A are determined and updated jointly with the second check node values 412B at each variable node flip.

Referring to FIG. 6A, in some embodiments, the first check node values 412A of the set of check nodes 402 are used to select the subset of variable nodes 404 to be flipped, and the second check node values 412A of the set of check nodes 402 are used to determine whether the data validity condition 408 is satisfied. The delayed update 604 is switched to the immediate update 606 for the first check node values 412 of the set of check nodes 402 in accordance with a determination of any condition 608, 610, or 612.

Figure 6B:
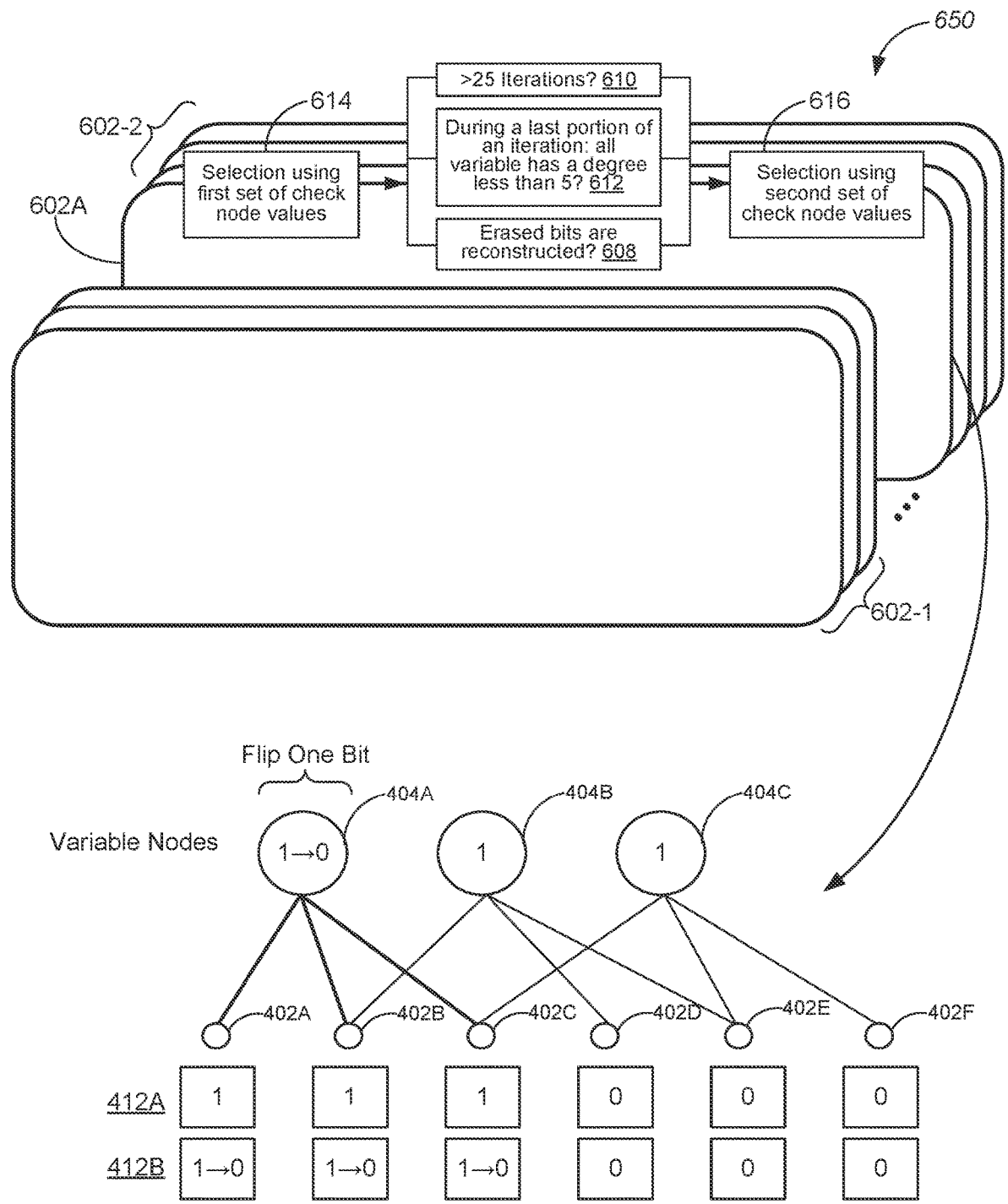
FIG. 6B is a diagram illustrating another example process of correcting errors in a block of data stored in a memory device, in accordance with some embodiments.

FIG. 6B is a diagram illustrating another example process 650 of correcting errors in a block of data 302 stored in a memory device 240, in accordance with some embodiments. During the first set of iterations 602-1, the first check node values 412A of the set of check nodes 402 are used to select (operation 614) the subset of variable nodes 404 to be flipped, and the second check node values 412B are used to determine whether the data validity condition 408 is satisfied. During the second set of iterations 602-1, regardless of whether the immediate update 606 of the first check node values 412A is applied, the second check node values 412B are used to select (operation 616) the subset of variable nodes 404 to be flipped and determine whether the data validity condition 408 is satisfied. Stated another way, in some embodiments, in accordance with a determination of any condition 608, 610, or 612 during the iteration 602A, the second check node values 412B, which is updated in response to each variable node flip, is used in place of the first check node values 412A to select the subset of variable nodes 404 to be flipped in addition to determining whether the data validity condition 408 is satisfied.

This application is generally directed to applying a mixture of a delayed update 604 and an immediate update 606 of check node values in a plurality of iterations of error correction. In some embodiments, a bit-flipping decoder flips one bit and updates check node values 412B of the check nodes 402 immediately. Such an immediate update scheme speeds up convergence with fewer average iterations, which is good for min-sum. However, the immediate update can cause a failure in the bit-flipping decoder, particularly when a correct bit is mistakenly flipped to an incorrect bit. This bad flip prevents other bits from flipping, and leads to additional bad flips that further reinforce the bad flip. A set of first registers 232A (FIG. 4) are added to store first check node values 412A of the check nodes 402 provided by delayed updates. While second registers 232B (FIG. 4) are always updated immediately with the latest check node syndrome values that are determined in response to each variable node flip, the first registers 232A retain their existing values (i.e., the first check node values 412A) for a duration of time (e.g., limited to one iteration or less). Check-to-variable node messages are based on the delayed first check node values 412A, so that a subset of variable nodes are selected to be flipped based on the delayed check node values 412. Each variable node 404 is evaluated based on older versions of the check nodes 402, so that multiple bits are flip independently, reducing the impact of bad flips on other variable nodes 404.

In some embodiments, the delayed update 604 of the first check node values 412A is disabled initially in accordance with a determination that an initial syndrome weight (e.g., defined as the number of second check node values with a second value (e.g., "1")) is below a threshold weight value, thereby avoiding slowing down a process of error correction. In some embodiments, the delayed update 604 of the first check node values 412A is disabled dynamically during each iteration, in accordance with a determination that a current syndrome weight is below a threshold weight value. Referring to FIG. 5A or 5D, in accordance with a determination that the number of first check node values 412A indicating bit errors is greater than the threshold weight value (e.g., 3 out of 6), the memory device 240 disables the delayed update 604 at a start of the process of error correction or after the first iteration 502.

In some embodiments, strong or weak bits are added to the variable nodes 404. In some embodiments, strong or weak bits are added to the check nodes 402. In some embodiments, the memory device 240 monitors a number of time that a variable node 404 flips. By these means, a correction strength of the bit-flipping decoder can be controlled.

Figure 7:
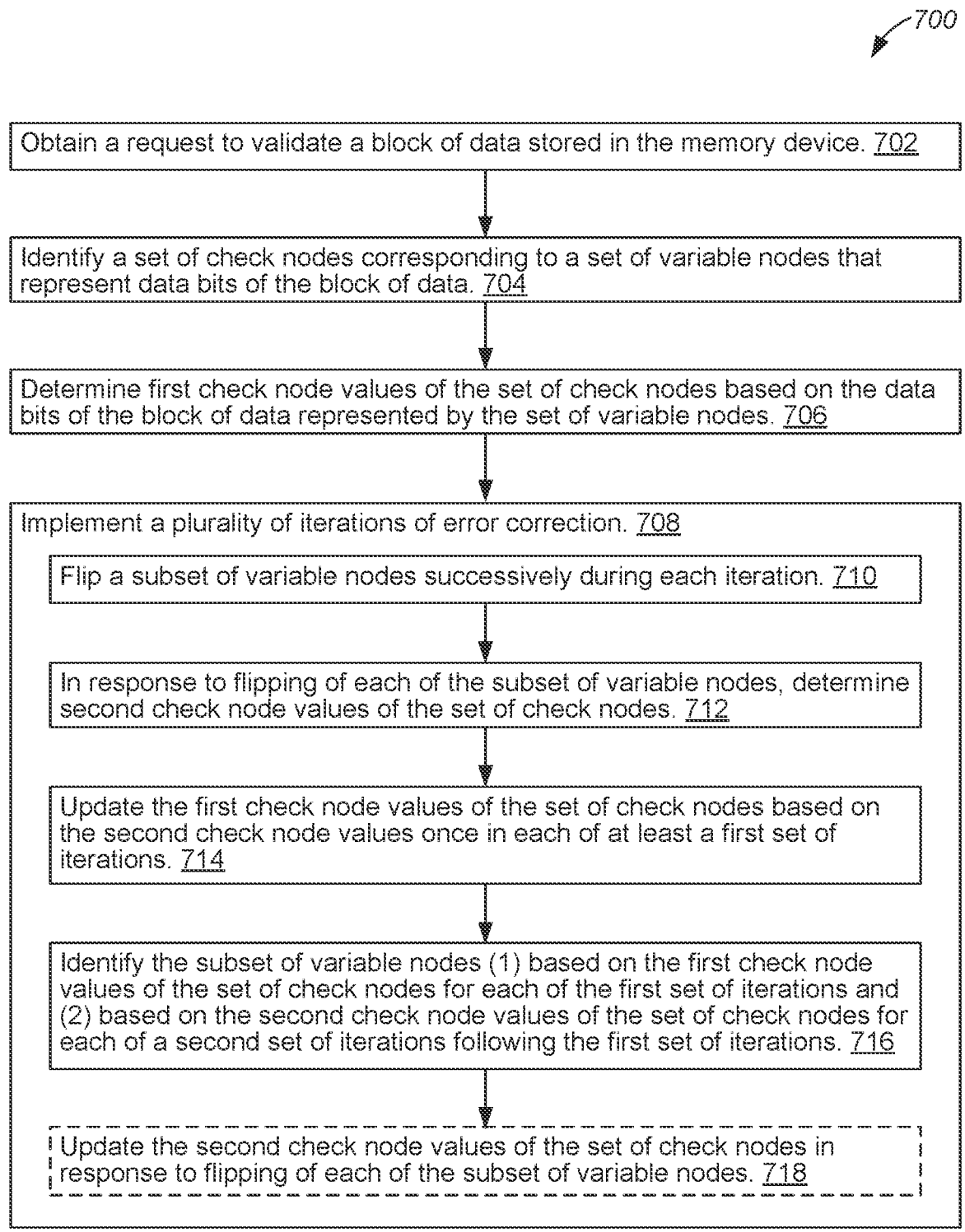
FIG. 7 is a flow diagram of an example method for correcting errors in a block of data stored in a memory device, in accordance with some embodiments.

FIG. 7 is a flow diagram of an example method for correcting errors in a block of data stored in a memory device 240, in accordance with some embodiments. The electronic system includes a memory system 200 that further includes a memory device 240 having a memory controller 202 (FIG. 2). The method 700 is implemented by the memory device 240. In an example, the memory device 240 includes an SSD that further includes the memory controller 202 and is configured to implement the method 700. The memory device 240 (e.g., a controller 280 of the memory device 240 in FIG. 2)

The memory device 240 obtains (operation 702) a request to validate a block of data 302 stored in the memory device 240, and identifies (operation 704) a set of check nodes 402 corresponding to a set of variable nodes 404 that represent data bits of the block of data 302. The memory device 240 determines (operation 706) first check node values 412A of the set of check nodes 404 (FIG. 4) based on the data bits of the block of data 302 represented by the set of variable nodes 404. The memory device 240 implements (operation 708) a plurality of iterations 602 of error correction by flipping (operation 710) a subset of variable nodes 404 successively during each iteration, 602 and in response to flipping of each of the subset of variable nodes 404, determining (operation 712) second check node values 412B of the set of check nodes 402. The memory device 240 updates (operation 714) the first check node values 412A of the set of check nodes 402 based on the second check node values 412B once in each of at least a first set of iterations 612-1. The memory device 240 identifies (operation 716) the subset of variable nodes 404 (1) based on the first check node values 412A of the set of check nodes 402 for each of the first set of iterations 602-1 and (2) based on the second check node values 412B of the set of check nodes 402 for each of a second set of iterations 602-2 following the first set of iterations 602-1. More details on error correction are explained above with reference to at least FIGS. 6A and 6B.

In some embodiments, the second check node values 412B of the set of check nodes 402 is updated (operation 718) in response to flipping of each of the subset of variable nodes 404, and used to determine whether a data validity condition 408 is satisfied, whether all bit errors in the block of data 302 have been corrected, or whether the plurality of iterations 602 of error correction can be terminated.

Figure 8:
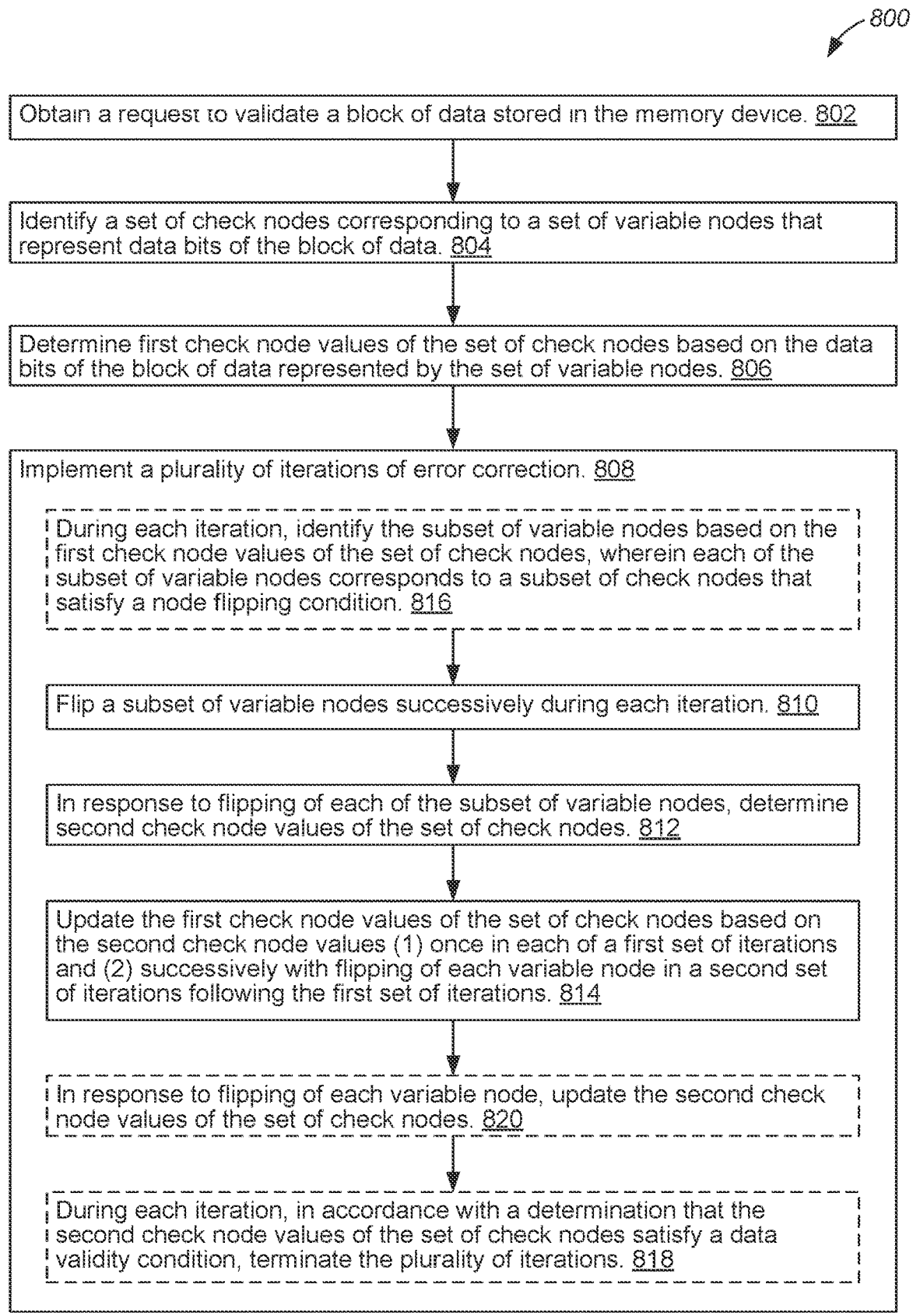
FIG. 8 is a flow diagram of another example method for correcting errors in a block of data stored in a memory device, in accordance with some embodiments.

FIG. 8 is a flow diagram of an example method for correcting errors in a block of data stored in a memory device 240, in accordance with some embodiments. The electronic system includes a memory system 200 that further includes a memory device 240 having a memory controller 202 (FIG. 2). The method 800 is implemented by the memory device 240. In an example, the memory device 240 includes an SSD that further includes the memory controller 202 and is configured to implement the method 800. The memory device 240 (e.g., a controller 280 of the memory device 240 in FIG. 2). The memory device 240 obtains (operation 802) a request to validate a block of data 302 stored in the memory device 240 and identifies (operation 804) a set of check nodes 402 corresponding to a set of variable nodes 404 that represent data bits of the block of data 302. The memory device 240 determines (operation 806) first check node values 412A of the set of check nodes 402 based on the data bits of the block of data 302 represented by the set of variable nodes 404. A plurality of iterations 602 of error correction are implemented (operation 808). The memory device 240 flips (operation 810) a subset of variable nodes 404 successively during each iteration 602, and in response to flipping of each of the subset of variable nodes 404, determines (operation 812) second check node values 412B of the set of check nodes 402. The memory device 240 updates (operation 814) the first check node values 412A of the set of check nodes 402 based on the second check node values 412B (1) once in each of a first set of iterations 602-1 and (2) successively with flipping of each variable node in a second set of iterations 602-2 following the first set of iterations 602-1. In an example, the first set of iterations 602-1 includes a single iteration. In another example, the second set of iterations 602-2 includes a single iteration.

In some embodiments, during each iteration 602, the memory device 240 identifies (operation 816) the subset of variable nodes 404 based on the first check node values 412A of the set of check nodes 402, and each of the subset of variable nodes 404 corresponds to a subset of check nodes 402 that satisfy a node flipping condition 406 (FIG. 4). Further, in some embodiments, a portion of the first check node values 412A of each of the subset of check nodes 402 has a second value (e.g., "1") indicating existence of a data error, and the node flipping condition 406 requires that each of the subset of variable nodes 404 flip in accordance with a determination that the portion is greater than a predefined error limit (e.g., 50%).

In some embodiments, during each iteration 602, in accordance with a determination that the second check node values 412B of the set of check nodes 402 satisfy a data validity condition 408, the memory device 240 terminates (operation 818) the plurality of iterations 602. Further, in some embodiments, after terminating the plurality of iterations 602, the memory device 240 disclaims the block of data 302 that was originally stored in the memory device 240, and rewrites, in the memory device 240, the data bits of the set of variable nodes 404 for use as the block of data 302. In some embodiments, in accordance with the data validity condition 408, all of the second check node values 412B are equal to a predefined first value (e.g., "0"), indicating that corresponding variable nodes 404 are free of errors.

In some embodiments, during a final iteration, in accordance with a determination that a number of iterations implemented prior to the final iteration reaches a predefined iteration limit, the memory device 240 terminates the plurality of iterations 602, and returns a message indicating that errors in the block of data 302 are uncorrectable.

In some embodiments, in response to flipping of each variable node 404, the memory device 240 updates (operation 820) the second check node values 412B of the set of check nodes 402. Further, in some embodiments, during each iteration 602, in accordance with a determination that a subset of the block of data 302 is reconstructed and successively in response to flipping of each variable node 404, the memory device 240 updates the first check node values 412A of the set of check nodes 402 with the second check node values 412B determined for the set of check nodes 402. In some embodiments, during a first iteration (e.g., 602A in FIG. 6A), the memory device 240 determines that the first iteration has a number of iterations 602 that are implemented immediately prior to the first iteration in the plurality of iterations 602. In accordance with a determination that the number of iterations 602 is greater than a predefined iteration number (e.g., 25, 30), successively in response to flipping of each following variable node 404, the memory device 240 updates the first check node values 412A of the set of check nodes 402 with the second check node values 412B determined for the set of check nodes 402.

In some embodiments, at a current time during a second iteration (e.g., 602A in FIG. 6A), the memory device 240 identifies, in the subset of variable nodes 404, a plurality of variable nodes 404 that flip prior to the current time and during a continuous portion of the second iteration. The memory device 240 determines that each of the plurality of variable nodes 404 has a degree that is less than a predefined degree number (e.g., 5). In accordance with a determination that each of the plurality of variable nodes 404 has the degree less than the predefined degree number, successively in response to flipping of each following variable node, the memory device 240 updates the first check node values 412A of the set of check nodes 402 with the second check node values 412B determined for the set of check nodes 402.

In some embodiments, the memory device 240 stores the first check node values 412A of the set of check nodes 402 in first registers 232A (FIG. 4), and the second check node values 412B of the set of check nodes 402 in second registers 232B (FIG. 4).

In some embodiments, the memory device 240 determines the first check node values 412A of the set of check nodes 402 by, for each of the set of check nodes 402, identifying a subset of variable nodes 404 that corresponds to the respective check node 402 and combining the subset of variable nodes 404 to determine the first check node value 412A of the respective check node 402. Further, in some embodiments, for each of the set of check nodes 402, in accordance with a determination the subset of variable nodes 404 includes a single variable node, the memory device 240 sets the first check node value 412A of the respective check node 402 according to a data bit represented by the single variable node 404. In accordance with a determination the subset of variable nodes 404 includes more than one variable node 404, the memory device 240 applies an XOR based logic to combine the subset of variable nodes 404 to determine the first check node value 412A of the respective check node 402.

In some embodiments, the first check node values 412A of the set of check nodes 402 is updated based on the second check node values 412B once and consistently at a start, at an end, or after a predefined number of variable node flips, of each of the first set of iterations 602. Alternatively, in some embodiments, the first check node values 412A of the set of check nodes 402 is updated based on the second check node values 412B once at a variable location of each of the first set of iterations 602.

In some embodiments, the above methods 700 or 800, electronic devices, or non-transitory computer readable storage medium for correcting data errors are also used in communication (e.g., wireless communication using 5G or Wi-Fi technology, satellite communications, Ethernet communication, and communication via fiber Optic networks).

Memory is also used to store instructions and data associated with the method 700 or 800, and includes high-speed random-access memory, such as SRAM, DDR DRAM, or other random access solid state memory devices; and, optionally, includes non-volatile memory, such as one or more magnetic disk storage devices, one or more optical disk storage devices, one or more flash memory devices, or one or more other non-volatile solid state storage devices. The memory, optionally, includes one or more storage devices remotely located from one or more processing units. Memory, or alternatively the non-volatile memory within memory, includes a non-transitory computer readable storage medium. In some embodiments, memory, or the non-transitory computer readable storage medium of memory, stores the programs, modules, and data structures, or a subset or superset for implementing method 700 or 800. Alternatively, in some embodiments, the electronic system implements the method 700 or 800 at least partially based on an ASIC. The memory system 200 of the electronic system includes an SSD in a data center or a client device.

Each of the above identified elements may be stored in one or more of the previously mentioned memory devices, and corresponds to a set of instructions for performing a function described above. The above identified modules or programs (i.e., sets of instructions) need not be implemented as separate software programs, procedures, modules or data structures, and thus various subsets of these modules may be combined or otherwise re-arranged in various embodiments. In some embodiments, the memory, optionally, stores a subset of the modules and data structures identified above. Furthermore, the memory, optionally, stores additional modules and data structures not described above.

The terminology used in the description of the various described implementations herein is for the purpose of describing particular implementations only and is not intended to be limiting. As used in the description of the various described implementations and the appended claims, the singular forms "a," "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. Additionally, it will be understood that, although the terms "first," "second," etc. may be used herein to describe various elements, these elements should not be limited by these terms. These terms are only used to distinguish one element from another.

As used herein, the term "if" is, optionally, construed to mean "when" or "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art.

Although various drawings illustrate a number of logical stages in a particular order, stages that are not order dependent may be reordered and other stages may be combined or broken out. While some reordering or other groupings are specifically mentioned, others will be obvious to those of ordinary skill in the art, so the ordering and groupings presented herein are not an exhaustive list of alternatives. Moreover, it should be recognized that the stages can be implemented in hardware, firmware, software or any combination thereof.

What is claimed is:

1. A method implemented at a memory device, comprising:
    obtaining a request to validate a block of data stored in the memory device;
    identifying a set of check nodes corresponding to a set of variable nodes that represent data bits of the block of data;
    determining first check node values of the set of check nodes based on the data bits of the block of data represented by the set of variable nodes; and
    implementing a plurality of iterations of error correction, including:
        flipping a subset of variable nodes successively during each iteration;
        in response to flipping of each of the subset of variable nodes, determining second check node values of the set of check nodes; and
        updating the first check node values of the set of check nodes based on the second check node values (1) once in each of a first set of iterations and (2) successively with flipping of each variable node in a second set of iterations following the first set of iterations.

2. The method of claim 1, wherein implementing the plurality of iterations of error correction further comprises, during each iteration:
    identifying the subset of variable nodes based on the first check node values of the set of check nodes, wherein each of the subset of variable nodes corresponds to a subset of check nodes that satisfy a node flipping condition.

3. The method of claim 2, wherein a portion of the first check node values of each of the subset of check nodes has a second value indicating existence of a data error, and the node flipping condition requires that each of the subset of variable nodes flip in accordance with a determination that the portion is greater than a predefined error limit.

4. The method of claim 1, wherein implementing the plurality of iterations of error correction further comprises, during each iteration:
in accordance with a determination that the second check node values of the set of check nodes satisfy a data validity condition, terminating the plurality of iterations.

5. The method of claim 4, further comprising:
after terminating the plurality of iteration, disclaiming the block of data that was originally stored in the memory device, and rewriting, in the memory device, the data bits of the set of variable nodes for use as the block of data.

6. The method of claim 4, wherein in accordance with the data validity condition, all of the second check node values are equal to a predefined first value, indicating that corresponding variable nodes are free of errors.

7. The method of claim 1, wherein implementing the plurality of iterations of error correction further comprises, during a final iteration:
in accordance with a determination that a number of iteration implemented prior to the final iteration reaches a predefined iteration limit, terminating the plurality of iterations, and returning a message indicating that errors in the block of data are uncorrectable.

8. The method of claim 1, further comprising:
in response to flipping of each variable node, updating the second check node values of the set of check nodes.

9. The method of claim 8, wherein implementing the plurality of iterations of error correction further comprises, during each iteration:
in accordance with a determination that a subset of the block of data is reconstructed, successively in response to flipping of each variable node, updating the first check node values of the set of check nodes with the second check node values determined for the set of check nodes.

10. The method of claim 8, wherein implementing the plurality of iterations of error correction further comprises, during a first iteration:
determining that the first iteration has a number of iterations that are implemented immediately prior to the first iteration in the plurality of iterations; and
in accordance with a determination that the number of iterations is greater than a predefined iteration number, successively in response to flipping of each following variable node, updating the first check node values of the set of check nodes with the second check node values determined for the set of check nodes.

11. The method of claim 8, wherein implementing the plurality of iterations of error correction further comprises, at a current time during a second iteration:
identifying, in the subset of variable nodes, a plurality of variable nodes that flip prior to the current time and during a continuous portion of the second iteration;
determining that each of the plurality of variable nodes has a degree that is less than a predefined degree number; and
in accordance with a determination that each of the plurality of variable nodes has the degree less than the predefined degree number, successively in response to flipping of each following variable node, updating the first check node values of the set of check nodes with the second check node values determined for the set of check nodes.

12. A memory device, comprising:
a memory controller; and
memory storing one or more programs thereon, the one or more programs further including instructions for:
obtaining a request to validate a block of data stored in a memory device;
identifying a set of check nodes corresponding to a set of variable nodes that represent data bits of the block of data;
determining first check node values of the set of check nodes based on the data bits of the block of data represented by the set of variable nodes; and
implementing a plurality of iterations of error correction, including:
flipping a subset of variable nodes successively during each iteration;
in response to flipping of each of the subset of variable nodes, determining second check node values of the set of check nodes; and
updating the first check node values of the set of check nodes based on the second check node values (1) once in each of a first set of iterations and (2) successively with flipping of each variable node in a second set of iterations following the first set of iterations.

13. The memory device of claim 12, the one or more programs further comprising instructions for:
storing the first check node values of the set of check nodes in first registers; and
storing the second check node values of the set of check nodes in second registers.

14. The memory device of claim 12, wherein determining the first check node values of the set of check nodes further comprises, for each of the set of check nodes:
identifying a subset of variable nodes that corresponds to the respective check node; and
combining the subset of variable nodes to determine the first check node value of the respective check node.

15. The memory device of claim 14, wherein for each of the set of check nodes, combining the subset of variable nodes further comprises:
in accordance with a determination the subset of variable nodes includes a single variable node, setting the first check node value of the respective check node according to a data bit represented by the single variable node; and
in accordance with a determination the subset of variable nodes includes more than one variable node, applying an XOR based logic to combine the subset of variable nodes to determine the first check node value of the respective check node.

16. The memory device of claim 12, wherein the first check node values of the set of check nodes is updated based on the second check node values once and consistently at a start, at an end, or after a predefined number of variable node flips, of each of the first set of iterations.

17. The memory device of claim 12, wherein the first check node values of the set of check nodes is updated based on the second check node values once at a variable location of each of the first set of iterations.

18. A non-transitory computer-readable storage medium storing one or more programs, the one or more programs comprising instructions for:

obtaining a request to validate a block of data stored in a memory device;

identifying a set of check nodes corresponding to a set of variable nodes that represent data bits of the block of data;

determining first check node values of the set of check nodes based on the data bits of the block of data represented by the set of variable nodes; and implementing a plurality of iterations of error correction, including:
- flipping a subset of variable nodes successively during each iteration;
- in response to flipping of each of the subset of variable nodes, determining second check node values of the set of check nodes; and updating the first check node values of the set of check nodes based on the second check node values (1) once in each of a first set of iterations and (2) successively with flipping of each variable node in a second set of iterations following the first set of iterations.

19. The non-transitory computer-readable storage medium of claim 18, wherein implementing the plurality of iterations of error correction further comprises, during each iteration:

identifying the subset of variable nodes based on the first check node values of the set of check nodes, wherein each of the subset of variable nodes corresponds to a subset of check nodes that satisfy a node flipping condition.

20. The non-transitory computer-readable storage medium of claim 18, wherein implementing the plurality of iterations of error correction further comprises, during each iteration:

in accordance with a determination that the second check node values of the set of check nodes satisfy a data validity condition, terminating the plurality of iterations.

* * * * *